(12) United States Patent
Choi et al.

(10) Patent No.: US 8,729,675 B1
(45) Date of Patent: May 20, 2014

(54) SEMICONDUCTOR DEVICE HAVING LINE-TYPE TRENCH TO DEFINE ACTIVE REGION AND METHOD OF FORMING THE SAME

(71) Applicants: Jay-Bok Choi, Hwaseong-si (KR); Kyu-Hyun Lee, Hwaseong-si (KR); Mi-Jeong Jang, Gimhae-si (KR); Young-Jin Choi, Hwaseong-si (KR); Ju-Young Huh, Yongin-si (KR)

(72) Inventors: Jay-Bok Choi, Hwaseong-si (KR); Kyu-Hyun Lee, Hwaseong-si (KR); Mi-Jeong Jang, Gimhae-si (KR); Young-Jin Choi, Hwaseong-si (KR); Ju-Young Huh, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 13/763,927

(22) Filed: Feb. 11, 2013

(30) Foreign Application Priority Data

Oct. 26, 2012 (KR) .......................... 10-2012-0119918

(51) Int. Cl.
*H01L 29/40* (2006.01)

(52) U.S. Cl.
USPC .................. 257/621; 257/E21.585; 257/586; 257/776; 438/129

(58) Field of Classification Search
CPC .................................................. H01L 29/40
USPC ................. 257/E21.585, E21.546, E23.131, 257/E27.084, E29.02, 202, 296, 506, 510, 257/586, 621, 776; 438/129, 343, 424
See application file for complete search history.

(56) References Cited

U.S. PATENT DOCUMENTS

| | | | |
|---|---|---|---|
| 5,298,775 A * | 3/1994 | Ohya | 257/211 |
| 6,020,092 A | 2/2000 | Sakoh | |
| 6,258,696 B1 | 7/2001 | Lee et al. | |
| 6,291,846 B1 | 9/2001 | Ema et al. | |
| 6,713,805 B2 * | 3/2004 | Tsunomura et al. | 257/304 |
| 7,332,252 B2 | 2/2008 | Kang et al. | |
| 7,381,575 B2 | 6/2008 | Wu et al. | |
| 7,642,572 B2 * | 1/2010 | Popp et al. | 257/211 |
| 7,875,921 B2 * | 1/2011 | Choi et al. | 257/315 |
| 7,998,870 B2 * | 8/2011 | Nam | 438/700 |
| 8,084,845 B2 * | 12/2011 | Torek et al. | 257/618 |
| 8,357,578 B2 * | 1/2013 | Kim | 438/284 |
| 2005/0018468 A1 * | 1/2005 | Honda | 365/145 |
| 2008/0035956 A1 * | 2/2008 | Manning | 257/202 |

(Continued)

FOREIGN PATENT DOCUMENTS

| | | |
|---|---|---|
| KR | 10-2004-0033775 A | 4/2004 |
| KR | 10-2008-0088951 A | 10/2008 |
| KR | 10-2011-0112723 A | 10/2011 |

*Primary Examiner* — Chris Chu
(74) *Attorney, Agent, or Firm* — Lee & Morse, P.C.

(57) ABSTRACT

A semiconductor device includes a plurality of parallel-trenches that are parallel to each other, a plurality of intersect-trenches that are parallel to each other, a plurality of active regions that are confined by the parallel-trenches and the intersect-trenches, a plurality of lower conductive lines that cross the active regions, a plurality of upper conductive lines that are parallel to each other, that cross the lower conductive lines, and that cross over the active regions, and data storage elements connected to the active regions. Each of the parallel-trenches and the intersect-trenches is a straight line. The parallel-trenches cross the upper conductive lines and form a first acute angle with the upper conductive lines. The intersect-trenches cross the parallel-trenches and form a second acute angle with the parallel-trenches.

25 Claims, 31 Drawing Sheets

(56) References Cited

U.S. PATENT DOCUMENTS

| | | | |
|---|---|---|---|
| 2009/0200593 A1* | 8/2009 | Uchiyama | 257/296 |
| 2011/0024870 A1 | 2/2011 | Lee | |
| 2011/0049599 A1* | 3/2011 | Taketani | 257/302 |
| 2011/0065275 A1* | 3/2011 | Kim et al. | 438/666 |
| 2011/0079871 A1 | 4/2011 | Kim | |
| 2012/0056255 A1* | 3/2012 | Sukekawa | 257/296 |
| 2012/0241832 A1* | 9/2012 | Fischer | 257/311 |
| 2012/0326214 A1* | 12/2012 | Cho | 257/288 |

* cited by examiner

SEMICONDUCTOR DEVICE HAVING LINE-TYPE TRENCH TO DEFINE ACTIVE REGION AND METHOD OF FORMING THE SAME

CROSS-REFERENCE TO RELATED APPLICATION

This application claims priority under 35 U.S.C. §119 to Korean Patent Application No. 10-2012-0119918 filed on Oct. 26, 2012, and entitled: "Semiconductor Device Having Line-Type Trench to Define Active Region and Method of Forming the Same," the disclosure of which is hereby incorporated by reference in its entirety.

BACKGROUND

Various methods of forming an active region have been studied to achieve high integration and a sufficient contact area with a contact plug.

SUMMARY

Embodiments may be realized by providing a semiconductor device that includes a plurality of parallel-trenches parallel to each other on a semiconductor substrate, a plurality of intersect-trenches parallel to each other on the semiconductor substrate, a plurality of active regions confined by the parallel-trenches and the intersect-trenches on the semiconductor substrate, a plurality of lower conductive lines crossing the active regions, a plurality of upper conductive lines parallel to each other, crossing the lower conductive lines, and crossing over the active regions, and data storage elements connected to the active regions. Each of the parallel-trenches and the intersect-trenches is a straight line. The parallel-trenches cross the upper conductive lines and form a first acute angle with the upper conductive lines. The intersect-trenches cross the parallel-trenches and form a second acute angle with the parallel-trenches.

The intersect trenches may cross the upper conductive lines, and the second acute angle may be greater than the first acute angle. The intersect trenches may form a third acute angle greater than the second acute angle with the upper conductive lines. The intersect trenches may be parallel to the upper conductive lines, and the second acute angle may be substantially the same as the first acute angle. Each of the lower and upper conductive lines may be a straight line, and the upper conductive lines may form substantially right angles with the lower conductive lines. Spaces between the intersect-trenches may be greater than other spaces between the parallel trenches.

Embodiments may also be realized by a semiconductor device that includes first and second parallel-trenches parallel to each other on a semiconductor substrate, first and second intersect-trenches parallel to each other on the semiconductor substrate, an active region confined by the first and second parallel-trenches and the first and second intersect-trenches on the semiconductor substrate, a pair of word lines crossing the active region and parallel to each other, a bit line crossing over the active region and forming substantially right angles with the pair of word lines, a buried contact plug spaced apart from the bit line and connected to the active region, and a storage node on the buried contact plug. Each of the first and second parallel-trenches and the first and second intersect trenches is a straight line, the first and second parallel-trenches cross the bit line and form a first acute angle with the bit line, and the first and second intersect-trenches cross the first and second parallel trenches, and form a second acute angle with the first and second parallel trenches.

The active region may include a first side surface, a second side surface, a third side surface, and a fourth side surface. The first side surface may be confined by the first parallel-trench, the second side surface may be confined by the second parallel-trench, the third side surface may be confined by the first intersect-trench, and the fourth side surface may be confined by the second intersect trench. The second side surface may be parallel to the first side surface, and the fourth side surface may be parallel to the third side surface. The first side surface may be longer than the third side surface. The first side surface may be at least two times longer than the third side surface.

The active region may include a first end and a second end protruding away from the bit line, the second side surface and the third side surface may meet at the first end, and the first side surface and the fourth side surface may meet at the second end. The second end may in a point-symmetric relation to the first end. The buried contact plug may be connected to the first end. The first and second intersect-trenches cross the bit line, and the second acute angle may be greater than the first acute angle. The second acute angle may be about 28 degrees.

The first and second intersect-trenches may form a third acute angle greater than the second acute angle with the bit line. The active region may include a first end and a second end protruding away from the bit line, the first side surface and the fourth side surface may meet at the first end, and the second side surface and the third side surface may meet at the second end. The first and second intersect-trenches may be parallel to the bit line, and the second acute angle may be substantially the same as the first acute angle. The second acute angle may be about 21 degrees.

Embodiments may also be realized by providing parallel-trenches that include first, second, third, and fourth parallel-trenches parallel to each other on a semiconductor substrate, intersect trenches that include first, second, and third intersect-trenches parallel to each other on the semiconductor substrate, active regions that include first, second, third, and fourth active regions confined by the parallel-trenches and the intersect-trenches on the semiconductor substrate, word lines that include first, second, third, fourth, and fifth word lines crossing the active regions and parallel to each other, bit lines that include first and second bit lines crossing over the active regions and substantially forming right angles with the word lines, buried contact plugs spaced apart from the bit lines and connected to the active regions, and storage nodes on the buried contact plugs. Each of the parallel-trenches and the intersect-trenches is a straight line. The parallel-trenches form a first acute angle with the bit lines. The intersect-trenches cross the parallel-trenches and form a second acute angle with the parallel-trenches. The first active region is confined by the first parallel-trench, the second parallel-trench, the first intersect-trench, and the second intersect-trench, the second active region is confined by the second parallel-trench, the third parallel-trench, the first intersect-trench, and the second intersect-trench, the third active region is confined by the second parallel-trench, the third parallel-trench, the second intersect-trench, and the third intersect-trench, and the fourth active region is confined by the third parallel-trench, the fourth parallel-trench, the second intersect-trench, and the third intersect-trench. The first bit line crosses the first and third active regions, and the second bit line crosses the second and fourth active regions, and the first word line crosses the second active region, the second word line crosses the first and second active regions, the third word line crosses the first and fourth active regions, the fourth word line crosses the third and fourth active regions, and the fifth word line crosses the third active region.

Embodiments may also be realized by providing a method of forming a semiconductor device that includes forming a plurality of active regions confined by a plurality of parallel parallel-trenches and a plurality of parallel intersect-trenches on a semiconductor substrate, forming a plurality of lower conductive lines crossing the active regions, foaming a plurality of upper conductive lines crossing the lower conductive lines, crossing over the active regions, and parallel to each other, and forming data storage elements connected to the active regions. Each of the parallel-trenches and the intersect-trenches is a straight line. The parallel-trenches cross the upper conductive lines and form a first acute angle with the upper conductive lines. The intersect-trenches cross the parallel-trenches and form a second acute angle with the parallel-trenches.

Forming the active regions may include forming a mask layer on the semiconductor substrate, forming a plurality of preliminary parallel-trenches by patterning the mask layer, forming a plurality of preliminary intersect-trenches by patterning the mask layer, and etching the semiconductor substrate under the preliminary parallel-trenches and the preliminary intersect-trenches. Spaces between the preliminary intersect-trenches may be greater than other spaces between the preliminary parallel-trenches. The intersect-trenches may cross the upper conductive lines, and the second acute angle may be greater than the first acute angle. The intersect-trenches may be parallel to the upper conductive lines, and the second acute angle may be substantially the same as the first acute angle.

Embodiments may also be realized by providing a semiconductor device that includes a substrate, parallel-trenches that are in a non-intersecting relationship with each other, which each of the parallel-trenches are arranged at a slant with respect to a lateral side of the substrate and include an isolation layer therein, intersect-trenches that are in a non-intersecting relationship with each other, in which the intersect-trenches have intersection regions with the parallel-trenches and include the isolation layer therein, active regions and ends of the active regions are defined by the intersection regions, and lower and upper conductive lines that extend across the active regions in first and second directions, respectively, the first direction being different from the second direction. The parallel-trenches cross the upper conductive lines at a first acute angle, the parallel trenches cross the intersect-trenches at a second acute angle, and the intersection-trenches cross the upper conductive lines at a third acute angle.

The third acute angle may be greater than the first and second acute angles, and the second acute angle is greater than the first acute angle. The parallel trenches may be spaced apart from each other at a first distance and the intersect-trenches may be spaced apart from each other at a second distance. The second distance may be greater than the first distance. The parallel trenches and the intersect-trenches may be parallel to sides of the active regions without extending across the active regions so as to define isolation regions between the active regions. Each of the ends of the active regions may be adjacent to one of the intersect-trenches such that ends of adjacent ones of the active regions are spaced apart from each other by the intersect trenches.

BRIEF DESCRIPTION OF THE DRAWINGS

Features will become apparent to those of ordinary skill in the art by describing in detail exemplary embodiments with reference, as illustrated in the accompanying drawings in which like reference characters refer to the same parts throughout the different views. The drawings are not necessarily to scale, emphasis instead being placed upon illustrating specific principles. In the drawings.

DETAILED DESCRIPTION

Figure 1:
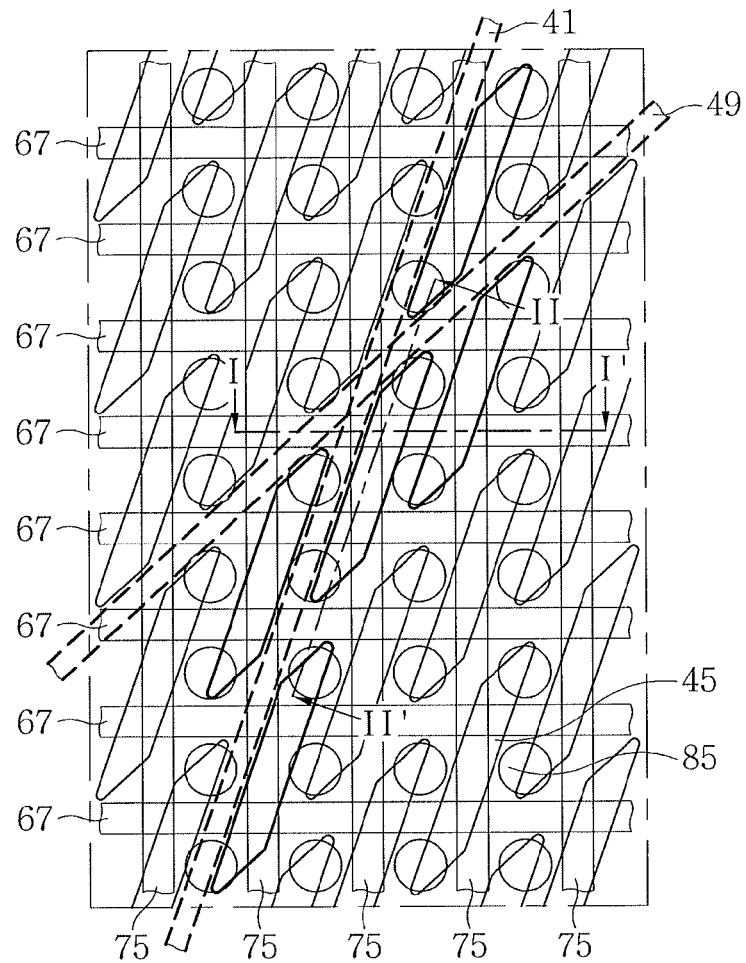
FIG. 1 illustrates a layout view for describing a semiconductor device in accordance with exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
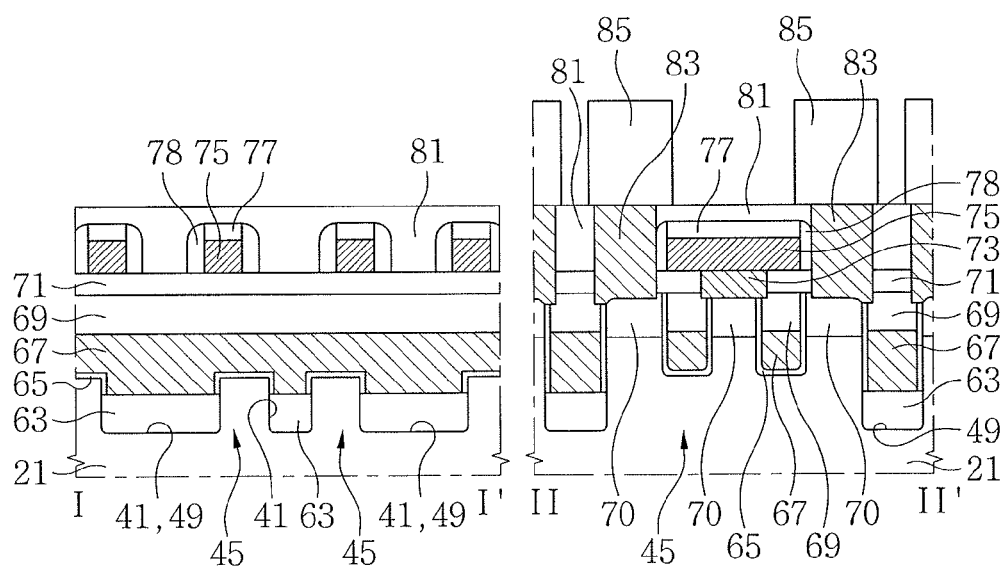
FIG. 2 illustrates cross-sectional views taken along lines I-I' and II-II' of FIG. 1.

FIG. 1 is a layout view for describing a semiconductor device in accordance with embodiments, FIG. 2 shows cross-sectional views taken along lines I-I' and II-II' of FIG. 1, and FIGS. 3 to 5 are enlarged views showing relationships between some configuration elements of FIG. 1, in detail.

Referring to FIGS. 1 and 2, a plurality of parallel-trenches 41 and intersect-trenches 49 by which a plurality of active regions 45 are confined may be formed in the semiconductor substrate 21. A device isolation layer 63 filling the parallel-trenches 41 and the intersect-trenches 49 may be formed. A plurality of word lines 67 intersecting the active regions 45 and the device isolation layer 63 may be formed. A gate dielectric layer 65 may be formed between the word lines 67 and the active regions 45. A capping layer 69 may be formed on the word lines 67. Source/drain regions 70 may be formed in the active regions 45 adjacent to both sides of the word lines 67.

A first interlayer insulating layer 71 covering the semiconductor substrate 21 may be formed. Bit plugs 73 passing through the first interlayer insulating layer 71 to be connected to the source/drain regions 70 may be formed. A plurality of bit lines 75 connected to the bit plugs 73 may be formed on the first interlayer insulating layer 71. Bit capping patterns 77 may be formed on the bit lines 75. Bit spacers 78 may be formed on sidewalls of the bit lines 75 and bit capping patterns 77.

A second interlayer insulating layer 81 covering the semiconductor substrate 21 may be formed. Buried contact plugs 83 passing through the second interlayer insulating layer 81 and the first interlayer insulating layer 71 to be connected to the source/drain regions 70 may be formed. A plurality of data storage elements 85 connected to the buried contact plugs 83 may be formed on the second interlayer insulating layer 81. The data storage elements 85 may include a storage node or a lower electrode.

The parallel-trenches 41 may be parallel to each other, e.g., the parallel-trenches 41 may be in a non-intersecting relationship with each other. Each of the parallel-trenches 41 may be a straight line, e.g., so as to be defined by a rectangular region. The intersect-trenches 49 may be parallel to each other. Each of the intersect-trenches 49 may be a straight line, e.g., so as to be defined by a rectangular region. The intersect-trenches 49 may be parallel to each other, e.g., the intersect-trenches 49 may be in a non-intersecting relationship with each other. Spaces between the intersect-trenches 49 may be greater than spaces between the parallel-trenches 41. The intersect-trenches 49 may cross the parallel-trenches 41. The word lines 67 may be parallel to each other, e.g., the word lines 67 may be in a non-intersecting relationship with each other. The word lines 67 may cross the active regions 45, e.g., may extend across the active regions in a first direction. Each of the word lines 67 may be a straight line. The bit lines 75 may cross over the active regions 45, e.g., may extend across the active regions in a second direction. Each of the bit lines 75 may be a straight line, e.g., so as to have a rectangular shape. The bit lines 75 may cross the word lines 67. For example, the bit lines 75 may form substantially right angles with the word lines 67. In a top-view, the parallel-trenches 41 may cross the bit lines 75. The intersect-trenches 49 may cross the bit lines 75.

In accordance with an embodiment, the intersect-trenches 49 may be straight lines. By way of forming the intersect-trenches 49 the process deviation may be significantly reduced and the manufacturing process may be simplified. The combination of the intersect-trenches 49 and the parallel-trenches 41 may be a configuration for the active regions 45 to protrude away from the bit lines 75. Contact areas between the buried contact plugs 83 and the source/drain regions 70 may be significantly increased.

Figure 3:
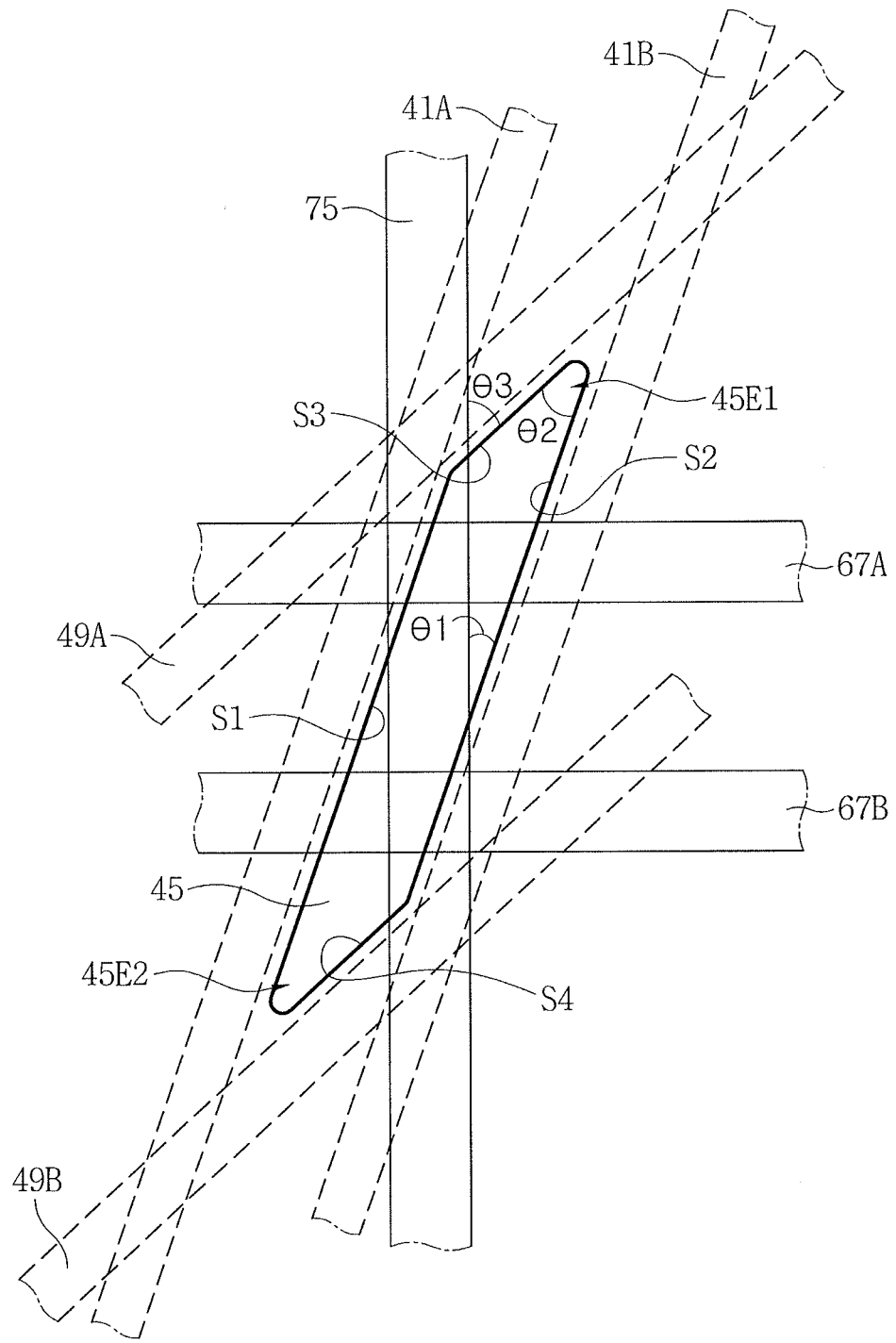
FIGS. 3 to 5 illustrate enlarged views showing relationships between some configuration elements of FIG. 1, in detail.

Referring to FIG. 3, a first parallel-trench 41A and a second parallel-trench 41B parallel to the first parallel-trench 41A may be provided. A first intersect-trench 49A and a second intersect-trench 49B parallel to the first intersect-trench 49A may be provided. An active region 45 may be confined by the first parallel-trench 41A, the second parallel-trench 41B, the first intersect-trench 49A, and the second intersect-trench 49B.

The active region 45 may include first to fourth side surfaces S1, S2, S3, and S4, e.g., that correspond to sidewalls of ones of the plurality of parallel-trenches 41 and intersect-trenches 29. The first side surface S1 may be confined by the first parallel-trench 41A. Referring to FIG. 3, the first side surfaces S1 is illustrated as being at a distance from the first parallel-trench 41A, e.g., for explanatory purposes. Accordingly, in an exemplary embodiment, the first side surface S1 may coincide with a sidewall of the first parallel-trench 41A. The second side surface S2 may be confined by the second parallel-trench 41B. The third side surface S3 may be confined by the first intersect-trench 49A. The fourth side surface S4 may be confined by the second intersect-trench 49B. The second side surface S2 may be parallel to the first side surface S1, and the fourth side surface S4 may be parallel to the third side surface S3. The first side surface S1 may be longer than the third side surface S3. For example, the horizontal length of the first side surface S1 may be greater than that of the third side surface S3 by two times or more. An area at which the second side surface S2 meets the third side surface S3 may be defined as a first end 45E1 of the active region 45, and an area at which the first side surface S1 meets the fourth side surface S4 may be defined as a second end 45E2 of the active region 45. The second end 45E2 may be interpreted as being in a point-symmetric relation to the first end 45E1.

A first word line 67A and second word line 67B crossing the active region 45 may be formed. A bit line 75 crossing the active region 45, the first word line 67A, and the second word line 67B may be formed. The bit line 75 may form right angles with the first word line 67A and the second word line 67B.

In a top view, the second parallel-trench 41B and the bit line 75 may form a first acute angle θ1. The second parallel-trench 41B and the first intersect-trench 49A may form a second acute angle θ2. The first intersect-trench 49A and the bit line 75 may form a third acute angle θ3. The second acute angle θ2 may be greater than the first acute angle θ1. The third acute angle θ3 may be greater than the second acute angle θ2, e.g., the third acute angle θ3 may also be greater than the first acute angle θ1. For example, the first acute angle θ1 may be about 21°, and the second acute angle θ2 may be about 28°. As illustrated in FIG. 3, the first acute angle θ1 may be interpreted as a crossing angle between the second side surface S2 and the bit line 75, and the second acute angle θ2 may be interpreted as a crossing angle between the second side surface S2 and the third side surface S3. The first end 45E1 may protrude away from the bit line 75. The second end 45E2 may protrude away from the bit line 75. Each of the first end 45E1 and the second end 45E2 may be connected corresponding one of the buried contact plugs (reference number 83 of FIG. 1).

Figure 4:
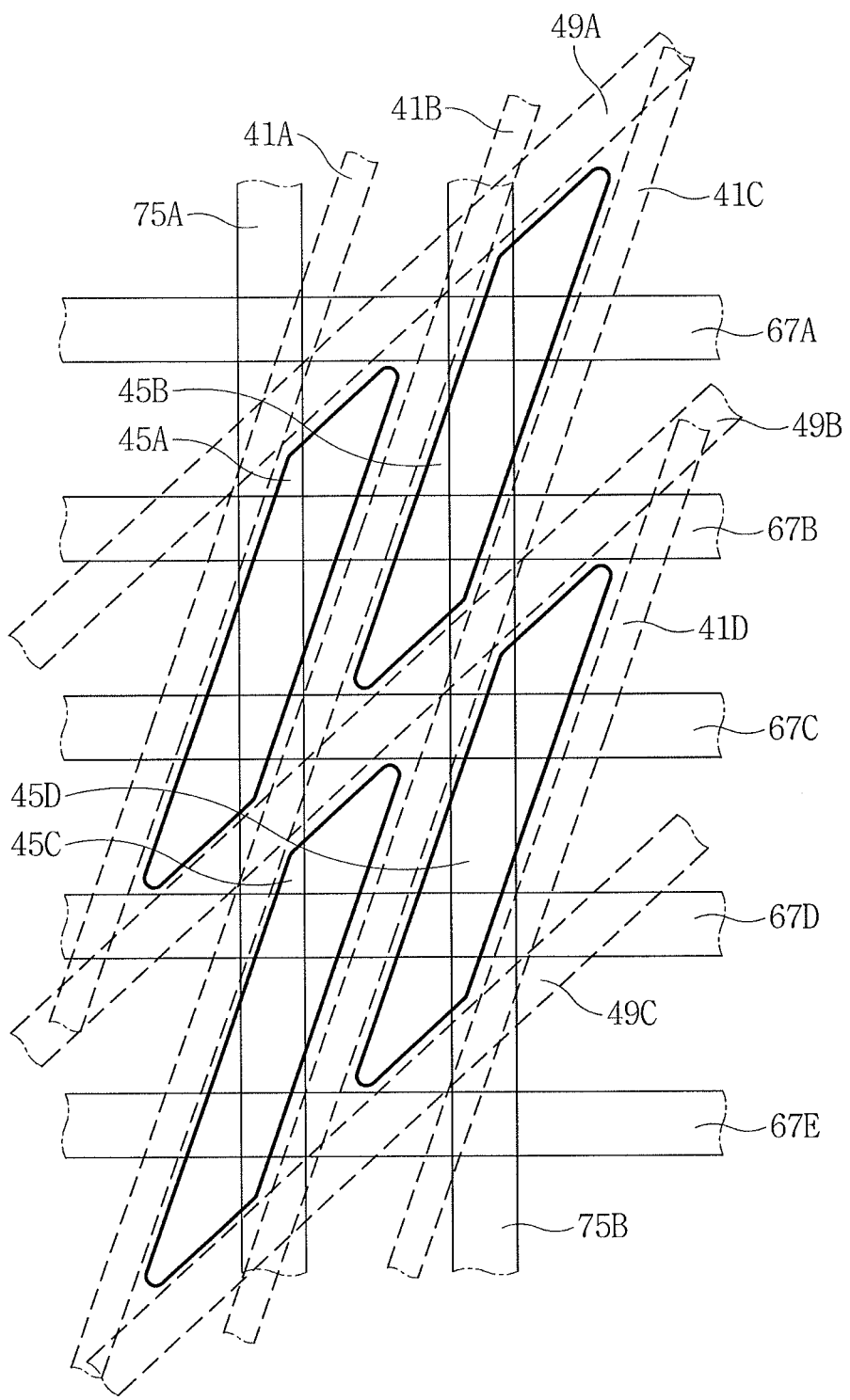

Referring to FIG. 4, a first parallel-trench 41A, a second parallel-trench 41B parallel to the first parallel-trench 41A, a third parallel-trench 41C parallel to the second parallel-trench 41B, and a fourth parallel-trench 41D parallel to the third parallel-trench 41C may be provided. A first intersect-trench 49A, a second intersect-trench 49B parallel to the first intersect-trench 49A, and a third intersect-trench 49C parallel to the second intersect-trench 49B may be provided. A first active region 45A may be confined by the first parallel-trench 41A, the second parallel-trench 41B, the first intersect-trench 49A, and the second intersect-trench 49B. A second active region 45B may be confined by the second parallel-trench 41B, the third parallel-trench 41C, the first intersect-trench 49A, and the second intersect-trench 49B. A third active region 45C may be confined by the second parallel-trench 41B, the third parallel-trench 41C, the second intersect-trench 49B, and the third intersect-trench 49C. A fourth active region 45D may be confined by the third parallel-trench 41C, the fourth parallel-trench 41D, the second intersect-trench 49B, and the third intersect-trench 49C.

A first word line 67A, a second word line 67B parallel to the first word line 67A, a third word line 67C parallel to the second word line 67B, a fourth word line 67D parallel to the third word line 67C, and a fifth word line 67E parallel to the fourth word line 67D may be provided. The first word line 67A may cross the second active region 45B. The second word line 67B may cross the first active region 45A and the second active region 45B. The third word line 67C may cross the first active region 45A and the fourth active region 45D. The fourth word line 67D may cross the third active region 45C and the fourth active region 45D. The fifth word line 67E may cross the third active region 45C. For example, each of the active regions 45 may be arranged so that two of the plurality of word lines 67 cross the active region 45.

A first bit line 75A crossing the first active region 45A and the third active region 45C, and intersecting the first to fifth word lines 67A, 67B, 67C, 67D, and 67E may be formed. A second bit line 75B parallel to the first bit line 75A, crossing the second active region 45B and the fourth active region 45D, and intersecting the first to fifth word lines 67A, 67B, 67C, 67D, and 67E may be formed.

Figure 5:
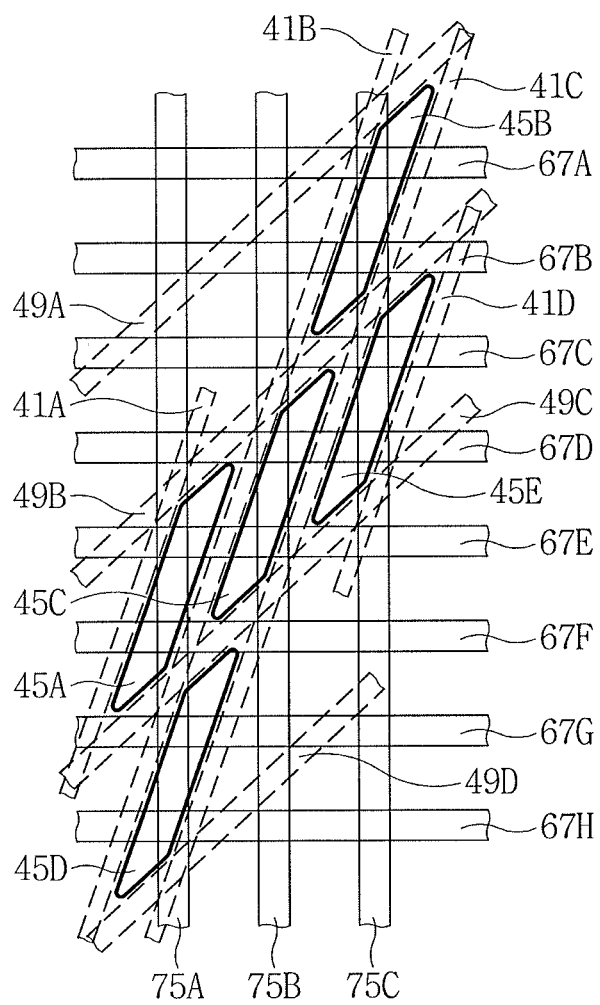

Referring to FIG. 5, a first parallel-trench 41A, a second parallel-trench 41B parallel to the first parallel-trench 41A, a third parallel-trench 41C parallel to the second parallel-trench 41B, and a fourth parallel-trench 41D parallel to the third parallel-trench 41C may be provided. A first intersect-trench 49A, a second intersect-trench 49B parallel to the first intersect-trench 49A, a third intersect-trench 49C parallel to second intersect-trench 49B, and a fourth intersect-trench 49D parallel to the third intersect-trench 49C may be provided.

A first active region 45A may be confined by the first parallel-trench 41A, the second parallel-trench 41B, the second intersect-trench 49B, and the third intersect-trench 49C. A second active region 45B may be confined by the second parallel-trench 41B, the third parallel-trench 41C, the first intersect-trench 49A, and the second intersect-trench 49B. A third active region 45C may be confined by the second parallel-trench 41B, the third parallel-trench 41C, the second intersect-trench 49B, and the third intersect-trench 49C. A fourth active region 45D may be confined by the second parallel-trench 41B, the third parallel-trench 41C, the third intersect-trench 49C, and the fourth intersect-trench 49D. A fifth active region 45E may be confined by the third parallel-trench 41C, the fourth parallel-trench 41D, the second intersect-trench 49B, and the third intersect-trench 49C.

A first word line 67A, a second word line 67B parallel to the first word line 67A, a third word line 67C parallel to the second word line 67B, a fourth word line 67D parallel to the third word line 67C, a fifth word line 67E parallel to the fourth word line 67D, a sixth word line 67F parallel to the fifth word line 67E, a seventh word line 67G parallel to the sixth word line 67F, and an eighth word line 67H parallel to the seventh word line 67G may be provided. The first word line 67A and the second word line 67B may cross the second active region 45B. The third word line 67C may cross the fifth active region 45E. The fourth word line 67D may cross the third active region 45C and the fifth active region 45E. The fifth word line 67E may cross the first active region 45A and the third active region 45C. The sixth word line 67F may cross the first active region 45A. The seventh word line 67G and the eighth word line 67H may cross the fourth active region 45D.

A first bit line 75A crossing the first active region 45A and the fourth active region 45D, and intersecting the first to eighth word lines 67A, 67B, 67C, 67D, 67E, 67F, 67G, and 67H may be formed. A second bit line 75B parallel to the first bit line 75A, crossing the third active region 45C, and intersecting the first to eighth word lines 67A, 67B, 67C, 67D, 67E, 67F, 67G, and 67H may be formed. A third bit line 75C parallel to the second bit line 75B, crossing the second active region 45B and the fifth active region 45E, and intersecting the first to eighth word lines 67A, 67B, 67C, 67D, 67E, 67F, 67G, and 67H may be formed. For example, each of the active regions 45 may be arranged so that one of, e.g., only one of, the plurality of bit lines 75 crosses the active region 45

Figure 6:
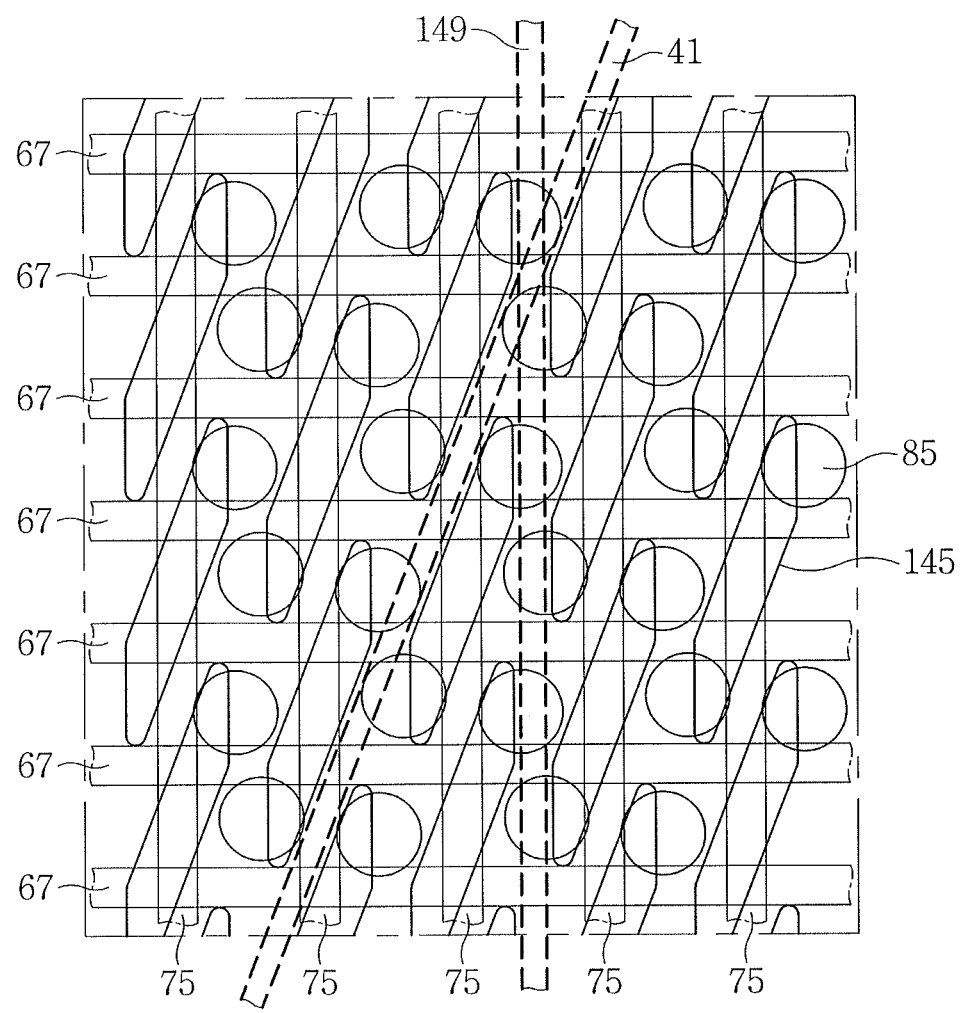
FIG. 6 illustrates a layout view for describing a semiconductor device in accordance with exemplary embodiments.
Figure 7:
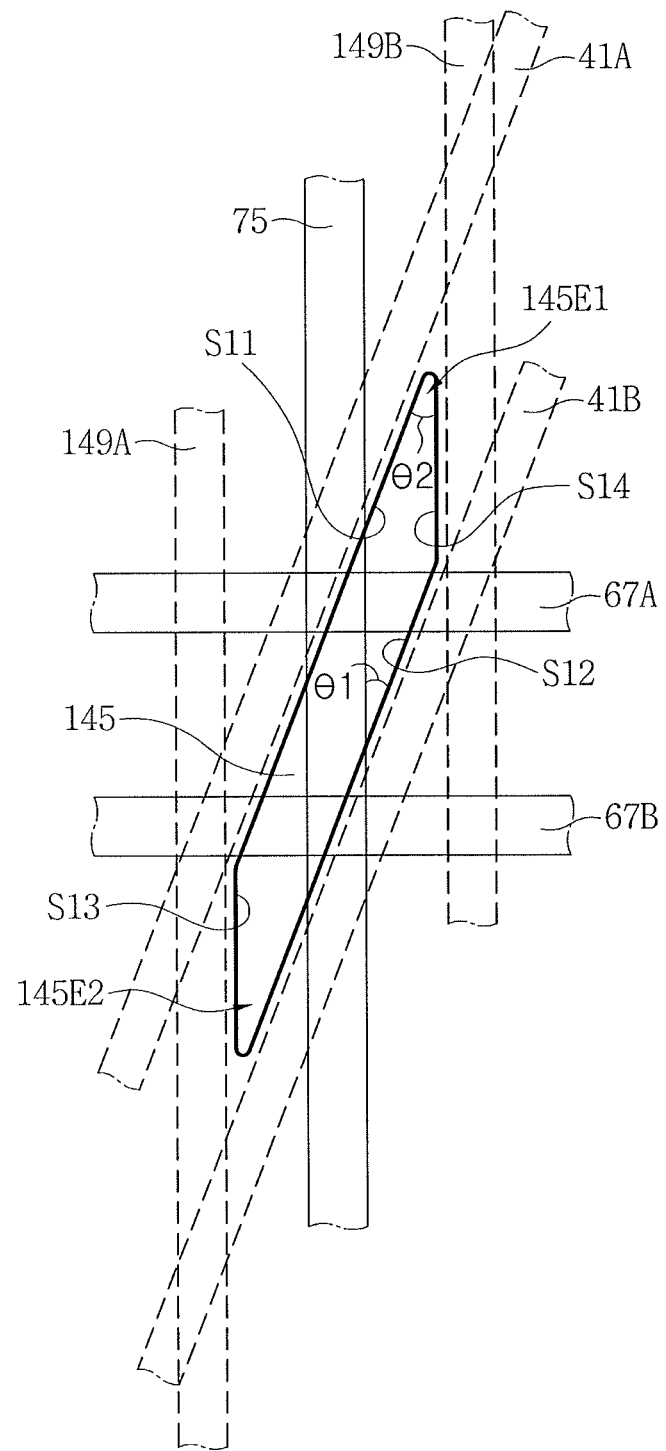
FIGS. 7 and 8 illustrate enlarged views showing relationships between some configuration elements of FIG. 6, in detail.
Figure 8:
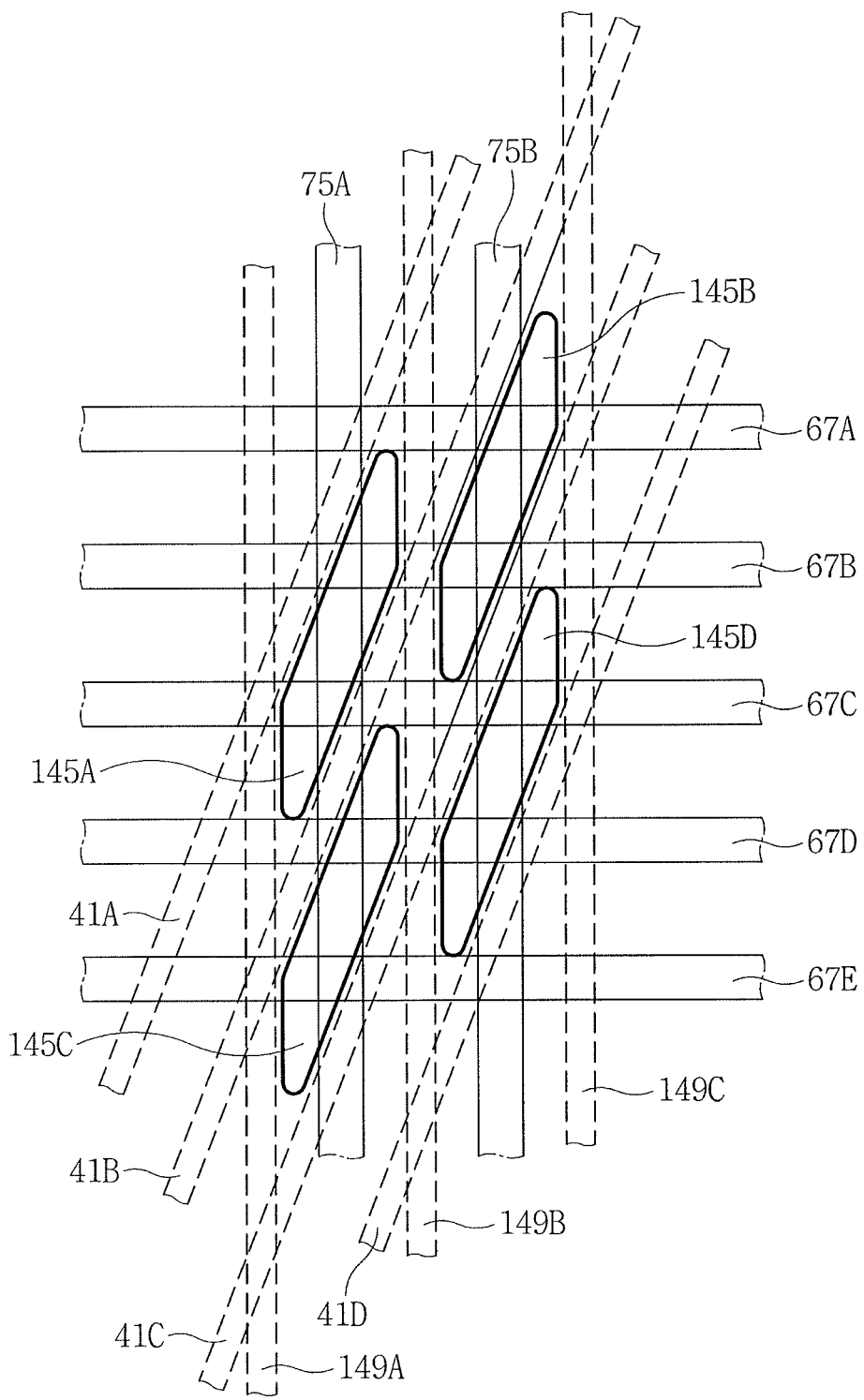

FIG. 6 is a layout for describing a semiconductor device in accordance with embodiments, and FIGS. 7 and 8 are enlarged views showing relationships between some configuration elements of FIG. 6 in detail.

Referring to FIG. 6, a plurality of parallel-trenches 41 and intersect-trenches 149 confining a plurality of active regions 145 may be formed in a semiconductor substrate 21. Hereinafter, only differences from the embodiment described with reference to FIGS. 1 and 5 will be briefly described. A plurality of word lines 67 crossing the active regions 145 may be formed. A plurality of bit lines 75 crossing over the active regions 145 and the word lines 67 may be formed. A plurality of data storage elements 85 may be formed on the semiconductor substrate 21.

The parallel-trenches 41 may be parallel to each other. Each of the parallel-trenches 41 may be a straight line. The intersect-trenches 149 may be parallel to each other. Each of the intersect-trenches 149 may be a straight line. The intersect-trenches 149 may cross the parallel-trenches 41. The word lines 67 may be parallel to each other. Each of the word lines 67 may be a straight line. The bit lines 75 may cross over the active regions 45. The bit lines 75 may be parallel to each other. Each of the bit lines 75 may be a straight line. The bit lines 75 may cross the word lines 67. In a top view, the parallel-trenches 41 may cross the bit lines 75. The intersect-trenches 149 may be parallel to the bit lines 75.

Referring to FIG. 7, a first parallel-trench 41A and a second parallel-trench 41B parallel to the first parallel-trench 41A may be provided. A first intersect-trench 149A and a second intersect-trench 149B parallel to the first intersect-trench 149A may be provided. An active region 145 may be confined by the first parallel-trench 41A, the second parallel-trench 41B, the first intersect-trench 149A, and the second intersect-trench 149B.

The active region 145 may include first to fourth side surfaces S11, S12, S13, and S14. The first side surface S11 may be confined by the first parallel-trench 41A. The second side surface S12 may be confined by the second parallel-trench 41B. The third side surface S13 may be confined by the first intersect-trench 149A. The fourth side surface S14 may be confined by the second intersect-trench 149B. The second side surface S12 may be parallel to the first side surface S11, and the fourth side surface S14 may be parallel to the third side surface S13. The first side surface S11 may be longer than the third side surface S13. An area at which the first side surface S11 and the fourth side surface S14 meet may be defined as a first end 145E1 of the active region 145, and an area at which the second side surface S12 and the third side surface S13 meet may be defined as a second end 145E2 of the active region 145. The second end 145E2 may be interpreted as being in a point-symmetric relation to the first end 145E1.

A first word line 67A and second word line 67B crossing the active region 145 may be formed. A bit line 75 crossing the active region 145 and intersecting the first word line 67A and the second word line 67B may be formed. The bit line 75 may form right angles with the first word line 67A and the second word line 67B.

In a top view, the second parallel-trench 41B and the bit line 75 may form a first acute angle θ1. The first parallel-trench 41A and the second intersect-trench 149B may form a second acute angle θ2. The bit line 75 may be arranged between the first intersect-trench 149A and the second intersect-trench 149B. The second acute angle θ2 may be the same as the first acute angle θ1. For example, the first acute angle θ1 and the second acute angle θ2 may be about 21°. As shown in FIG. 7, the first acute angle θ1 may be interpreted as a crossing angle between the second side surface S12 and the bit line 75, and second acute angle θ2 may be interpreted as a crossing angle between the first side surface S11 and the fourth side surface S14.

Referring to FIG. 8, a first parallel-trench 41A, a second parallel-trench 41B parallel to the first parallel-trench 41A, a third parallel-trench 41C parallel to the second parallel-trench 41B, and a fourth parallel-trench 41D parallel to the third parallel-trench 41C may be provided. A first intersect-trench 149A, a second intersect-trench 149B parallel to the first intersect-trench 149A, and a third intersect-trench 149C parallel to the second intersect-trench 149B may be provided. A first active region 145A may be confined by the first parallel-trench 41A, the second parallel-trench 41B, the first intersect-trench 149A, and the second intersect-trench 149B. A second active region 145B may be confined by the second parallel-trench 41B, the third parallel-trench 41C, the second intersect-trench 149B, and the third intersect-trench 149C. A third active region 145C may be confined by the second parallel-trench 41B, the third parallel-trench 41C, the first intersect-trench 149A, and the second intersect-trench 149B. A fourth active region 145D may be confined by the third parallel-trench 41C, the fourth parallel-trench 41D, the second intersect-trench 149B, and the third intersect-trench 149C.

A first word line 67A, a second word line 67B parallel to the first word line 67A, a third word line 67C parallel to the second word line 67B, a fourth word line 67D parallel to the third word line 67C, and a fifth word line 67E parallel to the fourth word line 67D may be provided. The first word line 67A may cross the second active region 145B. The second word line 67B may cross the first active region 145A and the second active region 45B. The third word line 67C may cross the first active region 145A and the fourth active region 145D. The fourth word line 67D may cross the third active region 145C and the fourth active region 145D. The fifth word line 67E may cross the third active region 145C.

A first bit line 75A crossing the first active region 145A and the third active region 145C, and intersecting the first to fifth word lines 67A, 67B, 67C, 67D, and 67E may be formed. A second bit line 75B parallel to the first bit line 75A, crossing the second active region 145B and the fourth active region 145D, and intersecting the first to fifth word lines 67A, 67B, 67C, 67D, and 67E may be formed. The first bit line 75A may be arranged between the first intersect-trench 149A and the second intersect-trench 149B. The second bit line 75B may be arranged between the second intersect-trench 149B and the third intersect-trench 149C.

Figure 9:
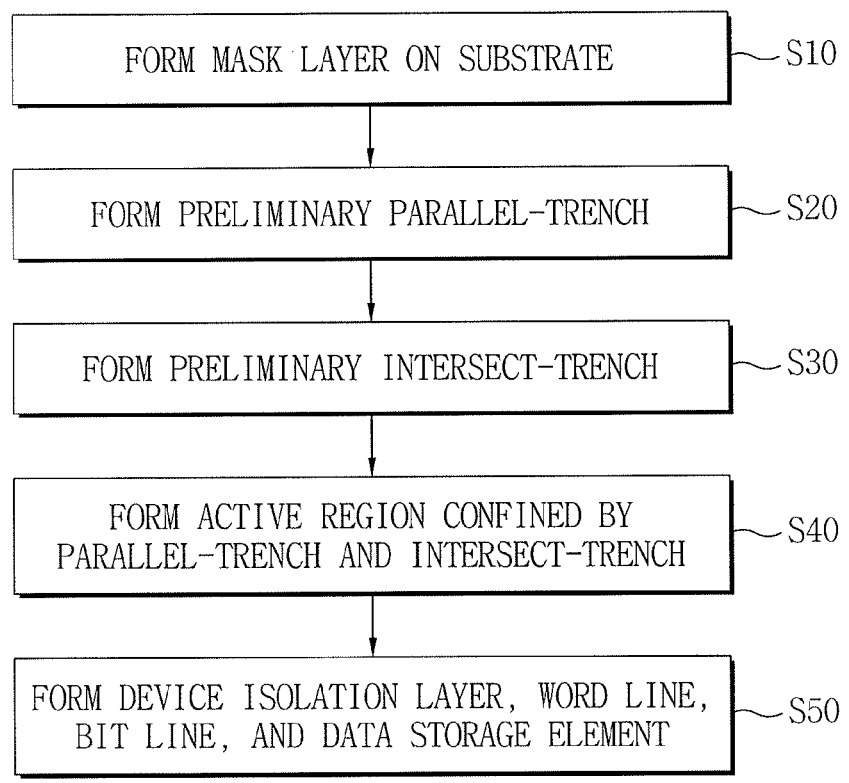
FIG. 9 illustrates a flowchart for describing methods of forming a semiconductor device in accordance with exemplary embodiments.

FIG. 9 is a flowchart for describing methods of forming a semiconductor device in accordance with embodiments.

Referring to FIG. 9, the methods of forming a semiconductor device in accordance with embodiments may include forming a mask layer on a semiconductor substrate (operation S10), forming a plurality of preliminary parallel-trenches by patterning the mask layer (operation S20), forming a plurality of preliminary intersect-trenches (operation S30), forming a plurality of active regions confined by the plurality of parallel-trenches and the plurality of intersect-trenches (operation S40), and forming a device isolation layer, a plurality of word lines, a plurality of bit lines, and a plurality of data storage elements (operation S50).

FIGS. 10, 11A, 13A, 14A, 15A, 15D, and 15F are perspective views for depicting stages in methods of forming a semiconductor device in accordance with embodiments, and FIGS. 11B, 12A, 13B, and 15B are layout views. FIGS. 11C, 12B, 13C, 14B, 15C, 15E, and 15G are cross-sectional views taken along lines I-I' and II-II' of various figures for describing methods of forming a semiconductor device in accordance with embodiments. FIGS. 15H, 15I, 15J, and 15K are enlarged views showing a part of FIG. 15B in detail.

Figure 10:
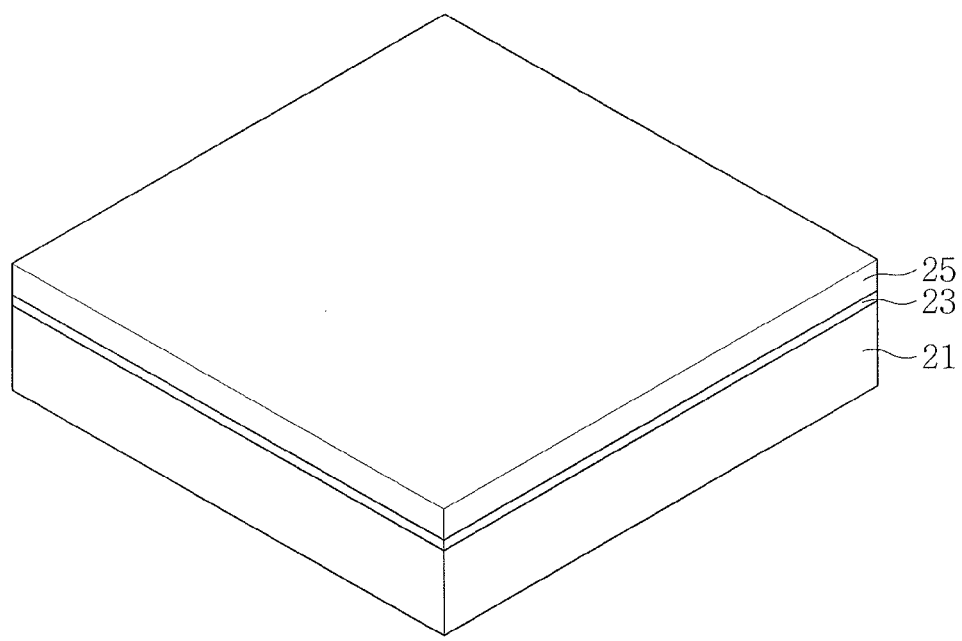
FIGS. 10, 11A, 13A, 14A, 15A, 15D, and 15F illustrate perspective views depicting stages in methods of forming a semiconductor device in accordance with exemplary embodiments.

Referring to FIGS. 9 and 10, first and second mask layers 23 and 25 may be formed on a semiconductor substrate 21 (operation S10). In this embodiment, the semiconductor substrate 21 may be a part of a DRAM cell array.

The semiconductor substrate 21 may be, e.g., a bulk silicon wafer or a silicon on insulator (SOI) wafer. The semiconductor substrate 21 may include a single crystalline semiconductor. The first mask layer 23 may cover a surface of the semiconductor substrate 21. The first mask layer 23 may include a material having an etch selectivity with respect to the semiconductor substrate 21. For example, the first mask layer 23 may include silicon oxide. The second mask layer 25 may cover the first mask layer 23. The second mask layer 25 may include a material having an etch selectivity with respect to the first mask layer 23. For example, the second mask layer 25 may include polysilicon.

In another embodiment, each of the first mask layer 23 and the second mask layer 25 may include two or more stacked layers. In still another embodiment, the first mask layer 23 may be omitted.

Figure 11A:
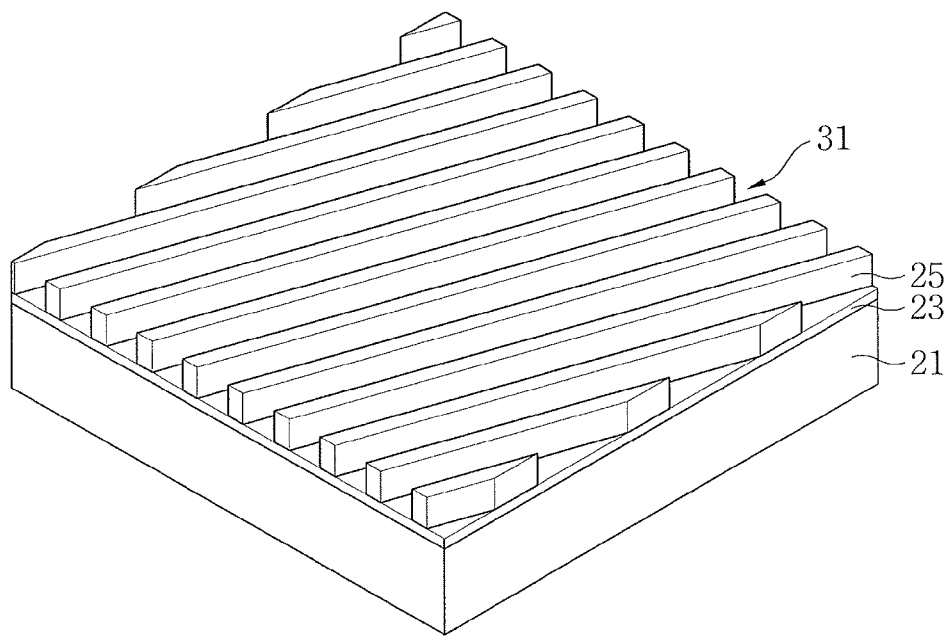
Figure 11B:
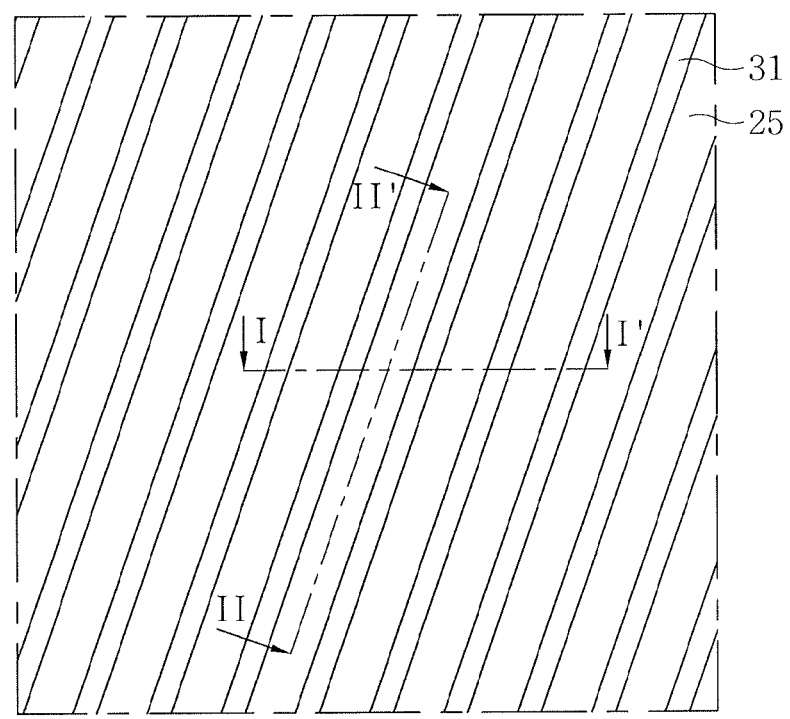
FIGS. 11B, 12A, 13B, and 15B illustrate layout views depicting stages in methods of forming a semiconductor device in accordance with exemplary embodiments.
Figure 11C:
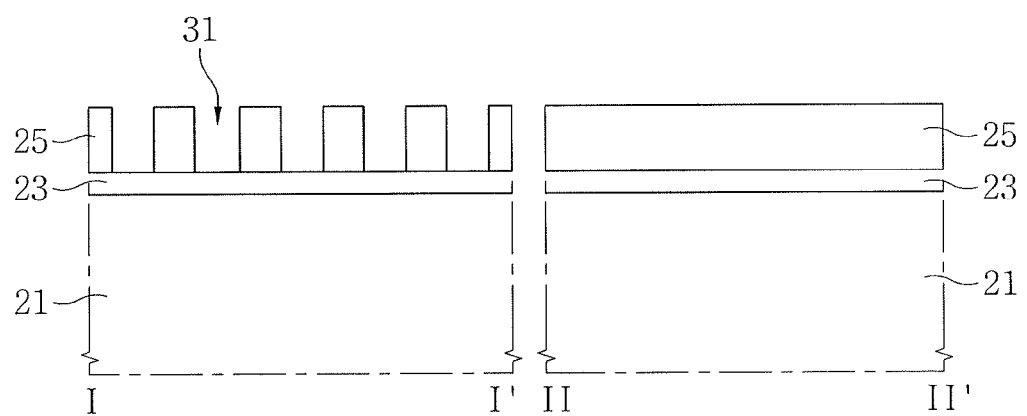
FIGS. 11C, 12B, 13C, 14B, 15C, 15E, and 15G illustrate cross-sectional views, taken along lines I-I' and II-II' in FIGS. 11B, 12A, 13B, 14A, 15B, 15D, and 15F, respectively, depicting stages in methods of forming a semiconductor device in accordance with exemplary embodiments.

Referring to FIGS. 9, 11A, 11B, and 11C, a plurality of preliminary parallel-trenches 31 parallel to each other may be formed by patterning the second mask layer 25 (operation S20). FIG. 11C illustrates a cross-sectional view taken along lines I-I' and II-II' of FIG. 11B.

A photolithography process and an etching process may be applied to the patterning of the second mask layer 25. For example, two or more photolithography processes and an anisotropic etching process may be applied to the patterning of the second mask layer 25. Each of the preliminary parallel-trenches 31 may be a straight line, e.g., may be defined by a rectangular region. The preliminary parallel-trenches 31 may be formed to be parallel to each other and to be arranged at a slant with respect to lateral sides of the substrate 21. Spaces between the preliminary parallel-trenches 31 may be substantially the same. The first mask layer 23 may be exposed through, e.g., on bottoms of, the preliminary parallel-trenches 31. The second mask layer 25 may be confined between the preliminary parallel-trenches 31 so that the preliminary parallel-trenches 31 define channels through the second mask layer 25.

Figure 12A:
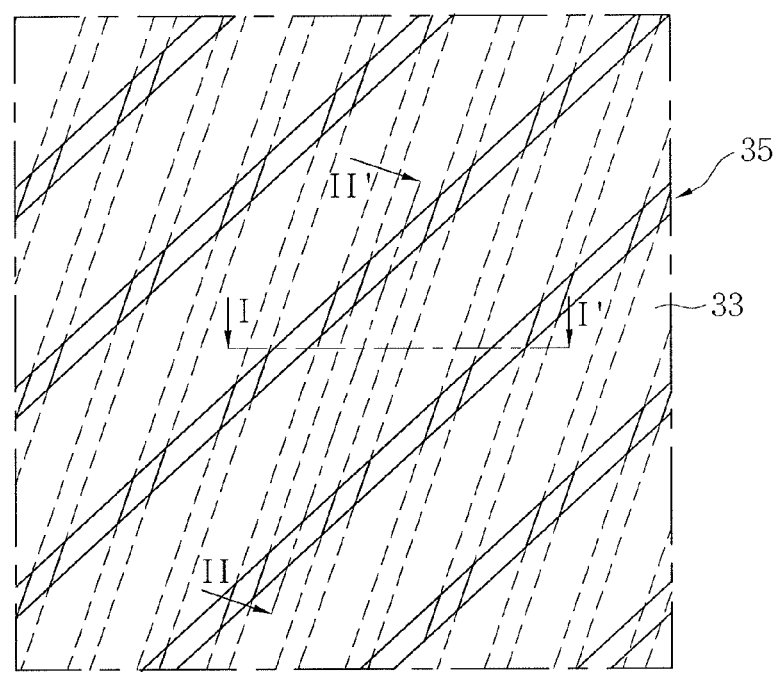
Figure 12B:
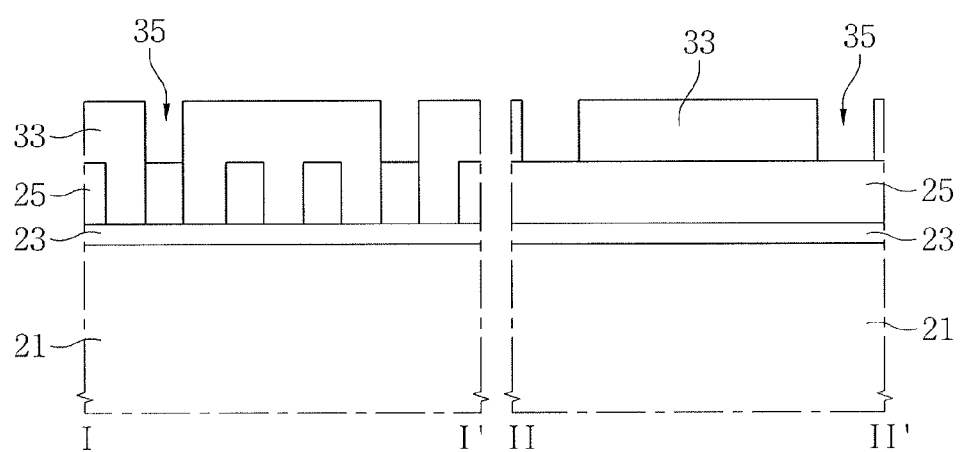

Referring to FIGS. 9, 12A, and 12B, an upper mask pattern 33 may be formed on the second mask layer 25. FIG. 12B illustrates a cross-sectional view taken along lines I-I' and II-II' of FIG. 12A. The upper mask pattern 33 may include a plurality of openings 35 parallel to each other. The openings 35 may cross the preliminary parallel-trenches 31 and partially expose the second mask layer 25.

The openings 35 may be formed using two or more photolithography processes. Each of the openings 35 may be a straight line.

Figure 13A:
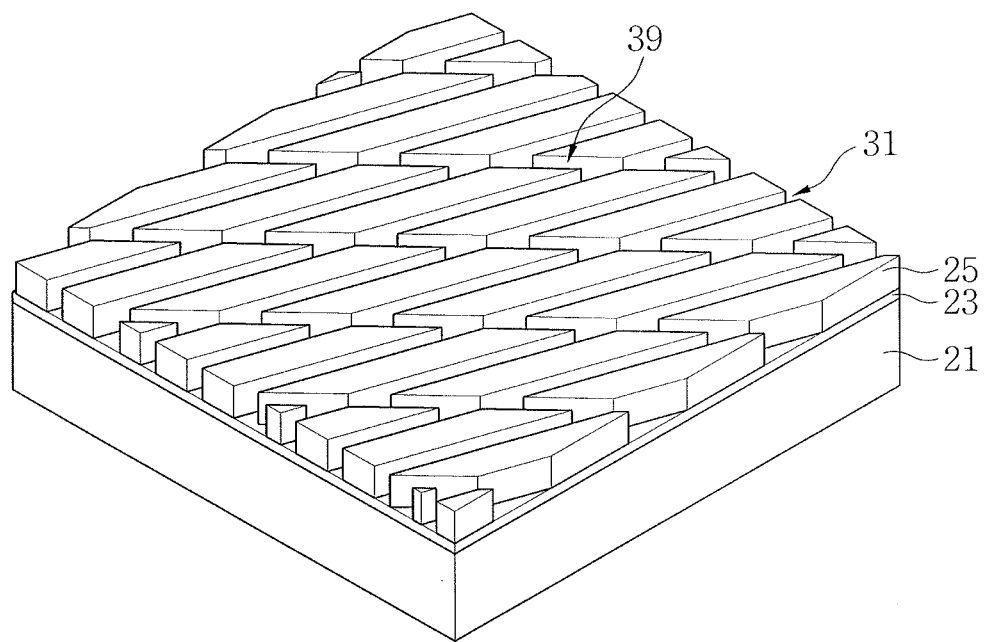
Figure 13B:
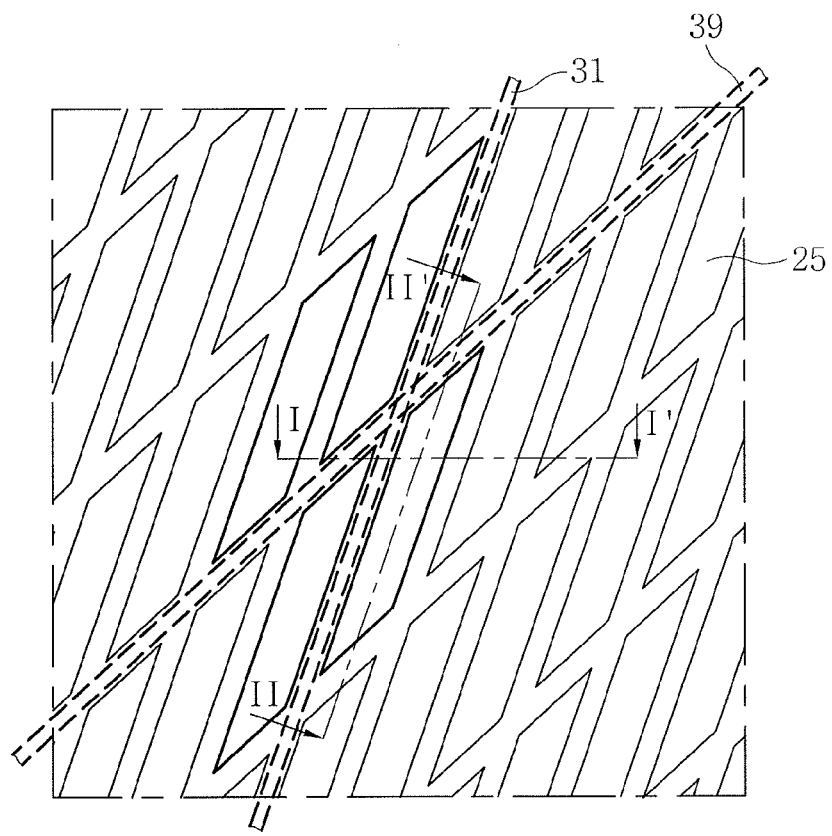
Figure 13C:
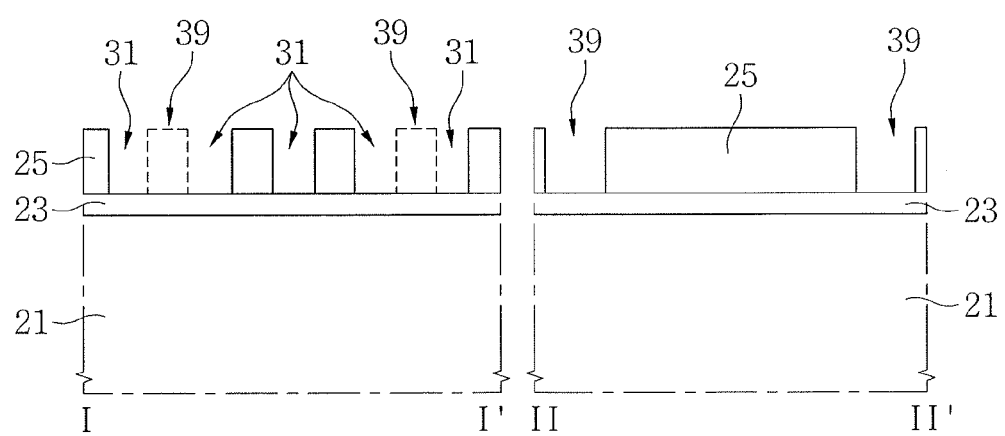

Referring to FIGS. 9, 13A, 13B, and 13C, a plurality of preliminary intersect-trenches 39 parallel to each other may be formed by patterning the second mask layer 25 (operation S30). FIG. 13C illustrates a cross-sectional view taken along lines I-I' and II-II' of FIG. 13B.

An anisotropic etching process using the upper mask pattern 33 as an etch mask may be applied to the patterning of the second mask layer 25. The preliminary intersect-trenches 39 may cross the preliminary parallel-trenches 31. The first mask layer 23 may be exposed on bottoms of the preliminary intersect-trenches 39. Each of the preliminary intersect-trenches 39 may be a straight line, e.g., may be defined by a rectangular region. The preliminary intersect-trenches 39 may be formed to be parallel to each other. Spaces between the preliminary intersect-trenches 39 may be substantially the same. The second mask layer 25 may be exposed by etching the upper mask pattern 33. The second mask layer 25 may be confined between the preliminary parallel-trenches 31 and the preliminary intersect-trenches 39. Spaces between the preliminary intersect-trenches 39 may be greater than those between the preliminary parallel-trenches 31.

Figure 14A:
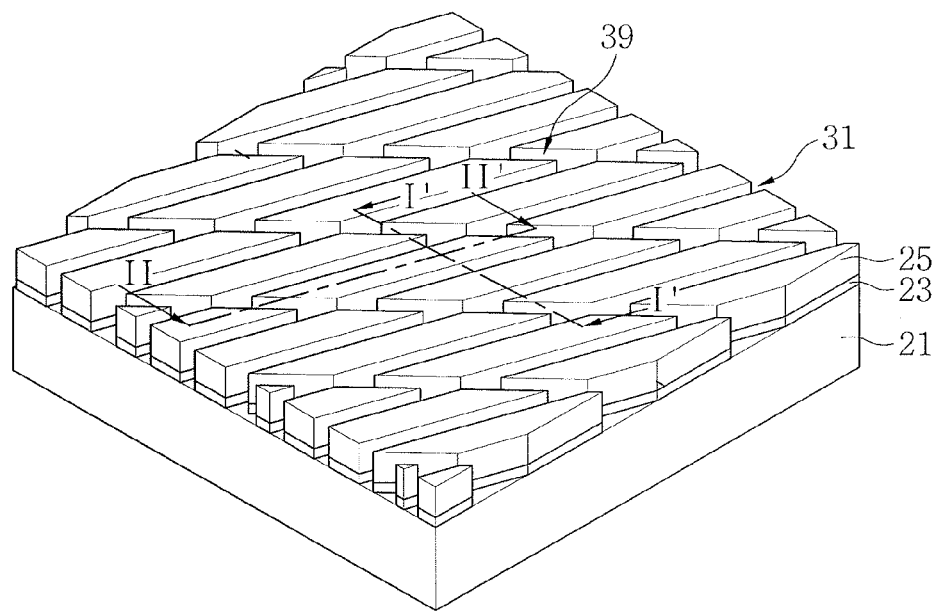
Figure 14B:
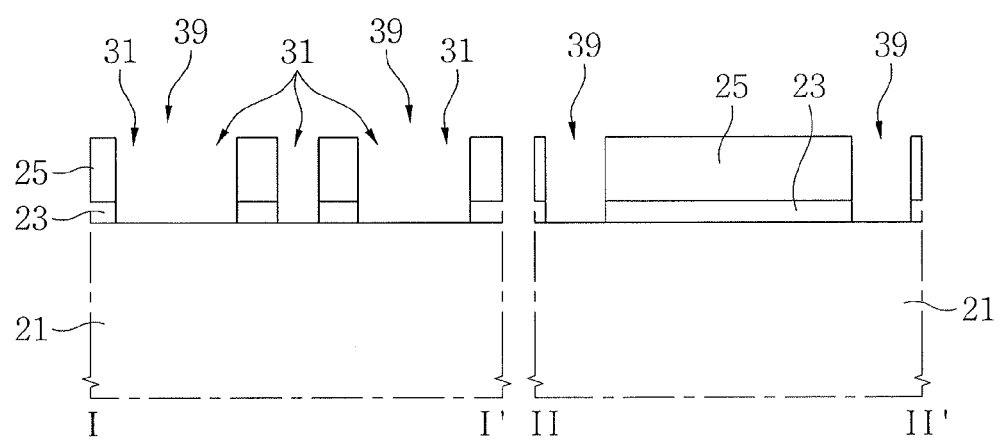

Referring to FIGS. 9, 14A, and 14B, the preliminary parallel-trenches 31 and the first mask layer 23 exposed on the bottom of the preliminary intersect-trenches 39 may be removed using the second mask layer 25 as an etch mask. An anisotropic etching process may be applied to the removal of the first mask layer 23. The semiconductor substrate 21 may be exposed on the bottoms of the preliminary parallel-trenches 31 and preliminary intersect-trenches 39. The first mask layer 23 may be retained between the second mask layer 25 and the semiconductor substrate 21. FIG. 14B illustrates a cross-sectional view taken along lines I-I' and II-II' of FIG. 14A.

Figure 15A:
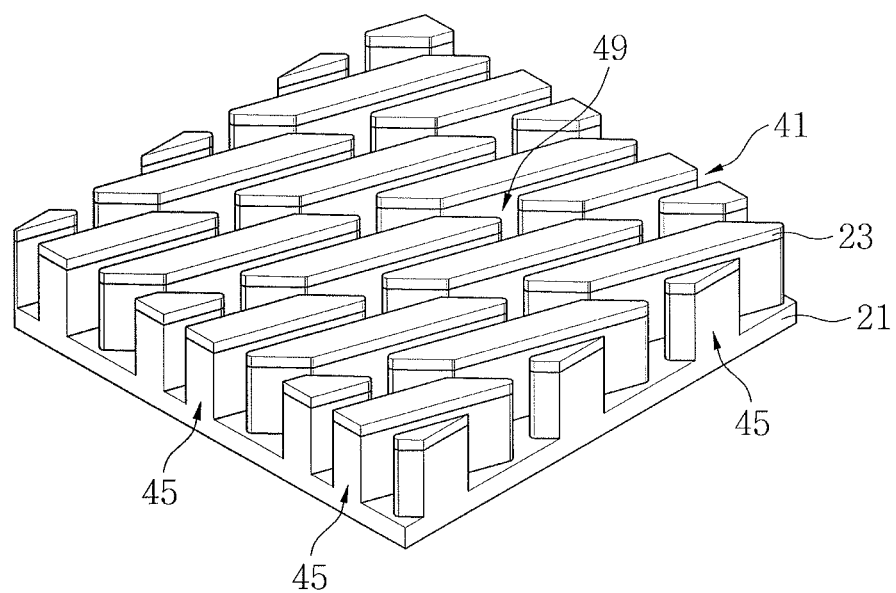
Figure 15B:
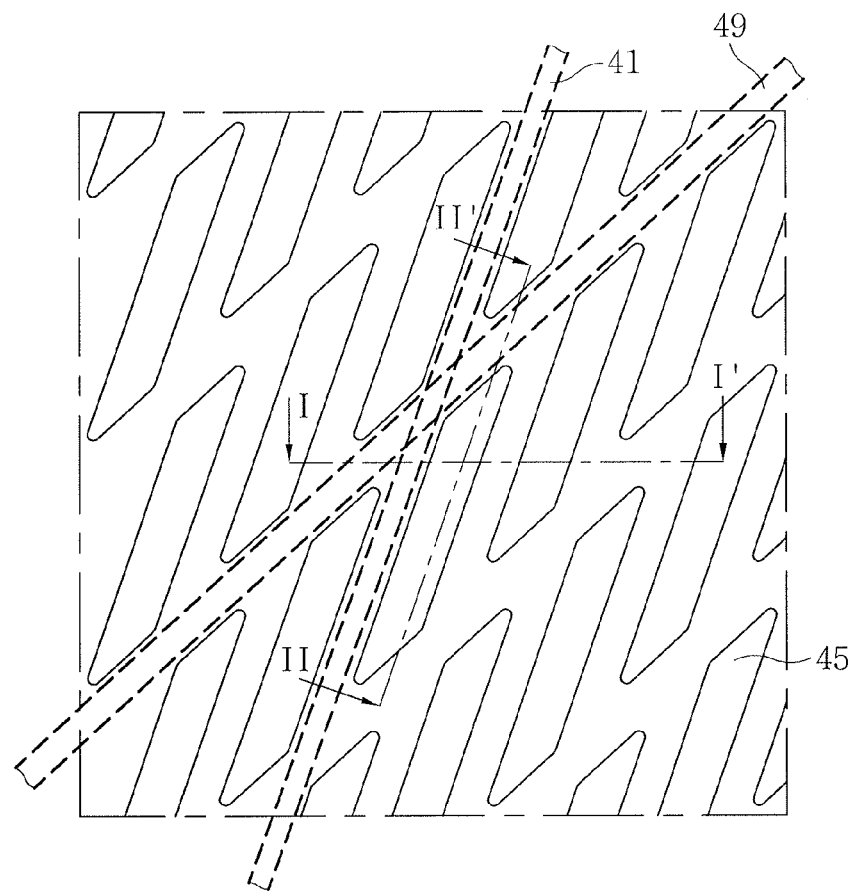
Figure 15C:
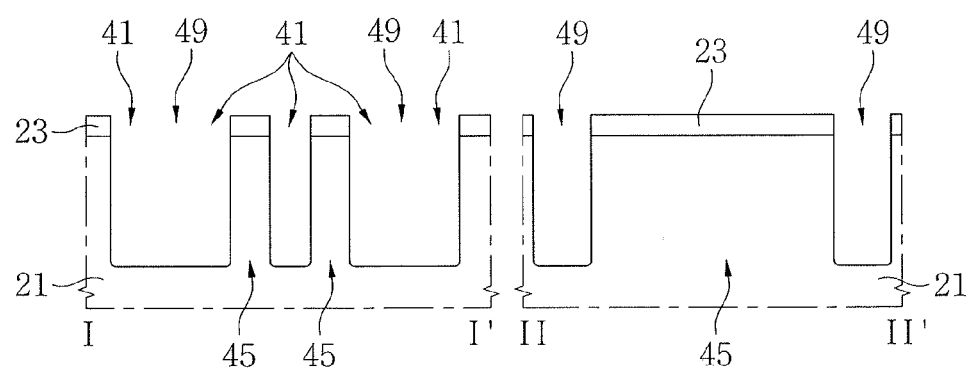

Referring to FIGS. 9, 15A, 15B, and 15C, parallel-trenches 41 and intersect-trenches 49 may be formed using the second mask layer 25 and the first mask layer 23 as an etch mask. FIG. 15C illustrates a cross-sectional view taken along lines I-I' and II-II' of FIG. 15B. A plurality of active regions 45 may be confined within the semiconductor substrate 21 using the parallel-trenches 41 and the intersect-trenches 49 (S40).

An anisotropic etching process may be applied to the formation of the parallel-trenches 41 and the intersect-trenches 49. The second mask layer 25 may be removed while the parallel-trenches 41 and the intersect-trenches 49 are formed. Each of the parallel-trenches 41 and the intersect-trenches 49 may be aligned on the bottoms of the preliminary parallel-trenches 31 and the preliminary intersect-trenches 39. Each of the active regions 45 may have a horizontal length greater than a horizontal width.

Referring to FIGS. 1, 2, and 9, a device isolation layer 63, a plurality of word lines 67, a plurality of bit lines 75, and a plurality of data storage elements 85 may be formed (S50).

The device isolation layer 63 may fill the parallel-trenches 41 and the intersect-trenches 49. The plurality of word lines 67 may be formed to cross the active regions 45 and the device isolation layer 63. A gate dielectric layer 63 may be formed between the word lines 67 and the active regions 45. A capping layer 69 may be formed on the word lines 67. The first mask layer 23 may be removed. Source/drain regions 70 may be formed in the active regions 45 adjacent to both sides of the word lines 67.

A first interlayer insulating layer 71 covering the semiconductor substrate 21 may be formed. Bit plugs 73 passing through the first interlayer insulating layer 71 and connected to the source/drain regions 70 may be formed. The plurality of bit lines 75 connected to the bit plugs 73 may be formed on the first interlayer insulating layer 71. Bit capping patterns 77 may be formed on the bit lines 75. Bit capping patterns 77 may be formed on sidewalls of the bit lines 75 and bit capping patterns 77.

The second interlayer insulating layer 81 covering the semiconductor substrate 21 may be formed. Buried contact plugs 83 passing through the second interlayer insulating layer 81 and the first interlayer insulating layer 71 and connected to the source/drain regions 70 may be formed. The plurality of data storage elements 85 connected to the buried contact plugs 8 may be formed on the second interlayer insulating layer 81. The data storage elements 85 may include a storage node or a lower electrode.

Although each of the parallel-trenches 41 and the intersect-trenches 49 may be formed to have an upper width greater or smaller than a lower width, the upper width will be illustrated as the same as the lower width to simplify the description. The device isolation layer 63 may include an insulating material such as silicon oxide, silicon nitride, or a combination thereof. For example, the device isolation layer 63 may include a silicon oxide layer covering sidewalls of the parallel-trenches 41 and intersect-trenches 49, a silicon nitride layer formed on the silicon oxide layer, and a silicon oxide layer formed on the silicon nitride layer.

The gate dielectric layer 63 may include silicon oxide, silicon nitride, silicon oxynitride, a high-K dielectric material, or a combination thereof. The word lines 67 may include a conductive material such as a metal, a metal silicide, polysilicon, or a combination thereof. The word lines 67 may be formed at a lower level than a top of the active regions 45. The word lines 67 may partially cover side surfaces of the active regions 45. The capping layer 69 may include an insulating material such as silicon oxide, silicon nitride, silicon oxynitride, or a combination thereof. The source/drain regions 70 may be formed by doping impurities into the active regions 45.

The first interlayer insulating layer 71 may include an insulating material such as silicon oxide, silicon nitride, silicon oxynitride, or a combination thereof. The bit plugs 73 and the bit lines 75 may include a conductive material such as a metal, a metal silicide, polysilicon, or a combination thereof. The bit capping patterns 77 may include an insulating material such as silicon oxide, silicon nitride, silicon oxynitride, or a combination thereof. The bit spacers 78 may include an insulating material such as silicon oxide, silicon nitride, silicon oxynitride, or a combination thereof.

The second interlayer insulating layer 81 may include an insulating material such as silicon oxide, silicon nitride, silicon oxynitride, or a combination thereof. The buried contact plugs 83 may include a conductive material such as a metal, a metal silicide, polysilicon, or a combination thereof. The data storage elements 85 may include a conductive material such as a metal, a metal silicide, polysilicon, or a combination thereof.

Figure 15D:
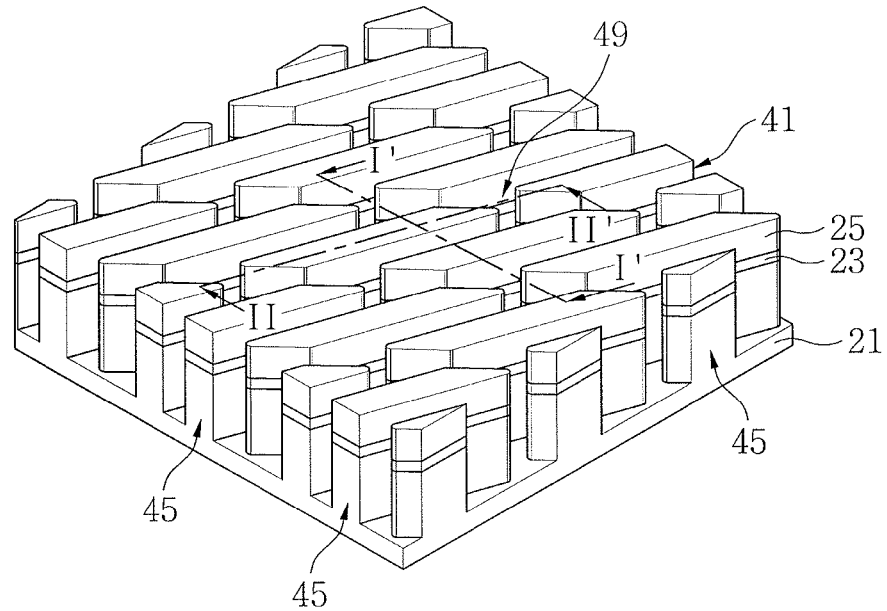
Figure 15E:
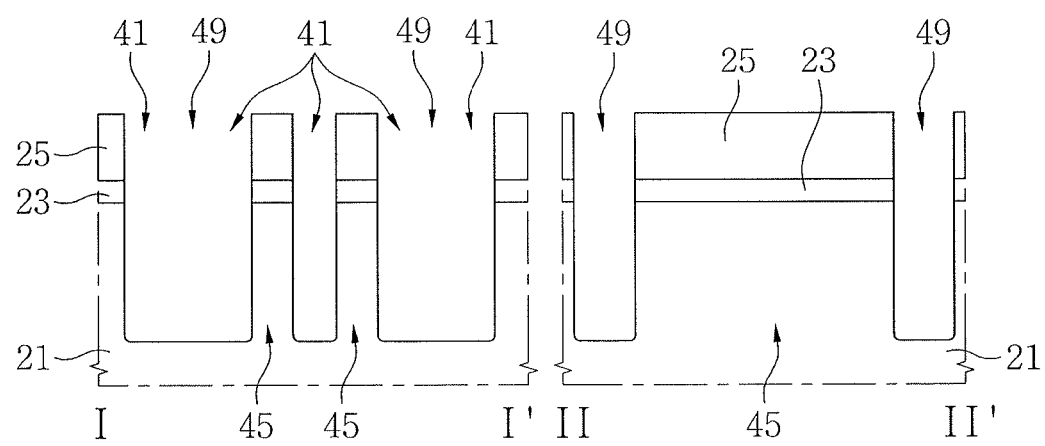

Referring to FIGS. 15D and 15E, in another embodiment, the second mask layer 25 may be retained on the first mask layer 23. Each of the parallel-trenches 41 and intersect-trenches 49 may be aligned along the bottom of the preliminary parallel-trenches 31 and the preliminary intersect-trenches 39. FIG. 15E illustrates a cross-sectional view taken along lines I-I' and II-II' of FIG. 15D.

Figure 15F:
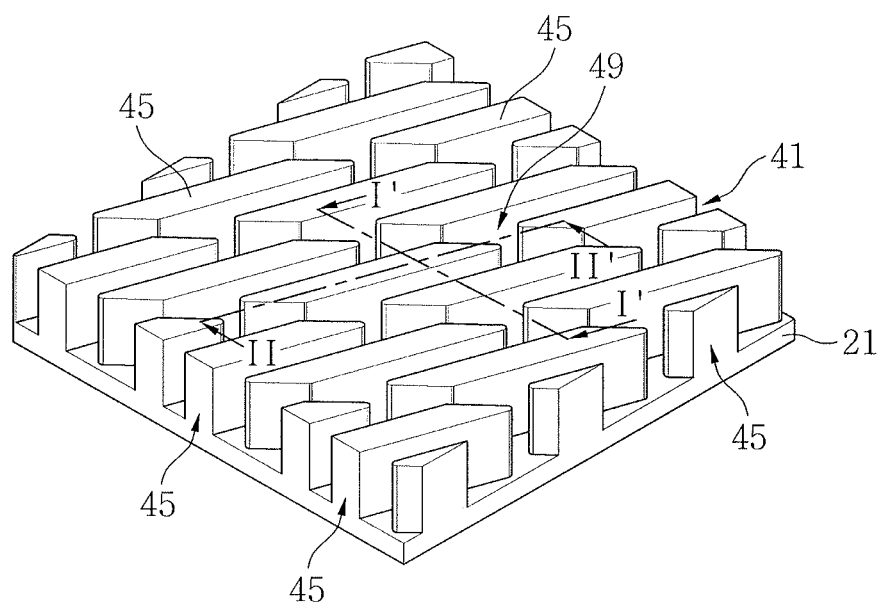
Figure 15G:
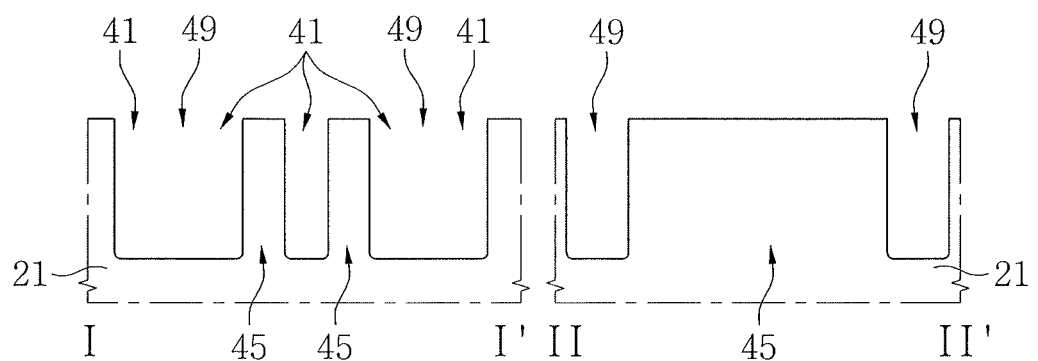

Referring to FIGS. 15F and 15G, in another embodiment, the active regions 45 may be exposed by removing the second mask layer 25 and the first mask layer 23. The active regions 45 may be confined by the parallel-trenches 41 and the intersect-trenches 49. FIG. 15G illustrates a cross-sectional view taken along lines I-I' and II-II' of FIG. 15F.

Figure 15H:
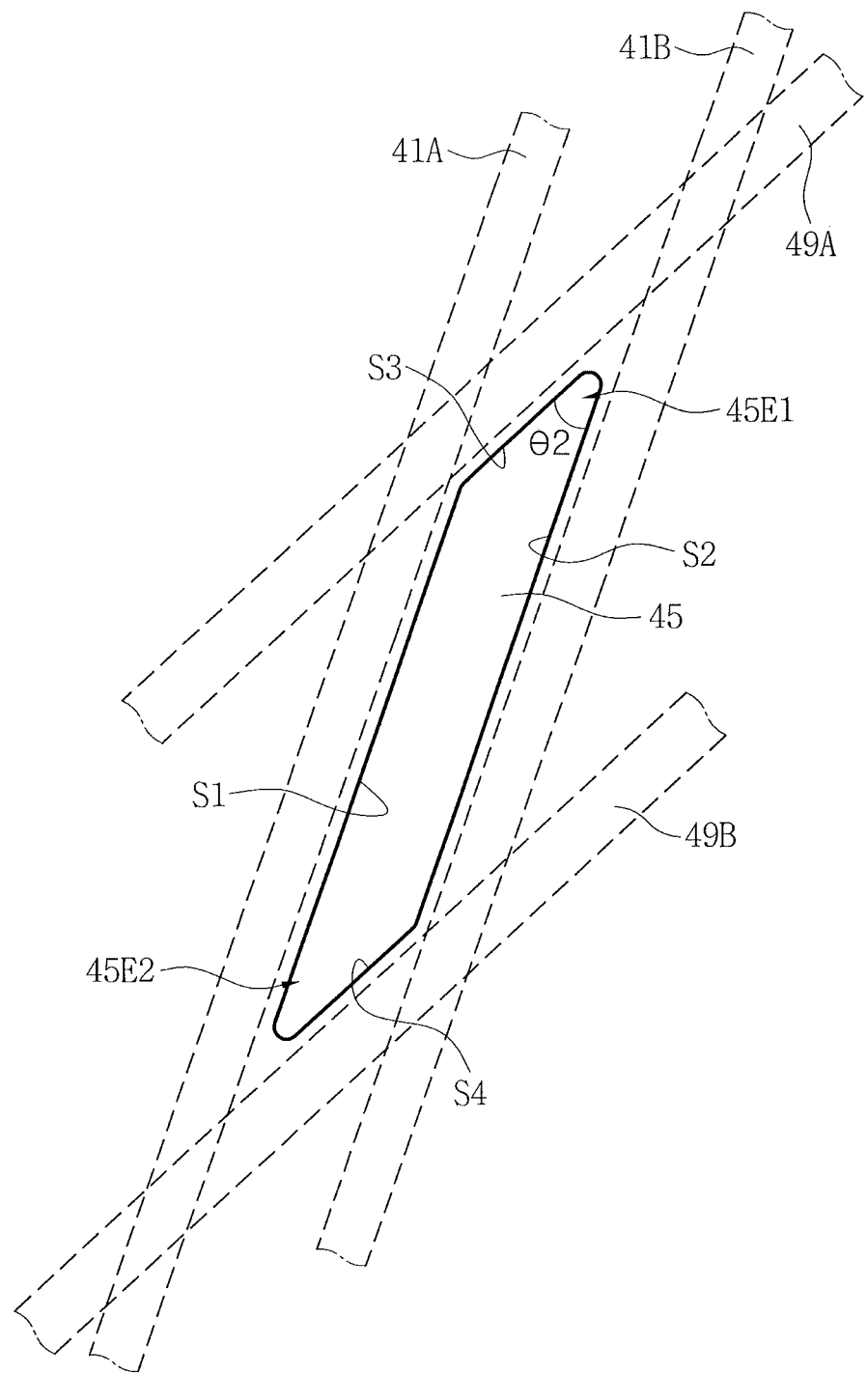
FIGS. 15H, 15I, 15J, and 15K illustrate enlarged views showing parts of FIG. 15B in detail.

Referring to FIG. 15H, a second parallel-trench 41B parallel to the first parallel-trench 41A and the first parallel-trench 41A may be provided. A second intersect-trench 49B parallel to the first intersect-trench 49A and the first intersect-trench 49A may be provided. The active region 45 may be confined by the first parallel-trench 41A, the second parallel-trench 41B, the first intersect-trench 49A, and the second intersect-trench 49B.

The active region 45 may include first to fourth side surfaces S1, S2, S3, and S4. The first side surface S1 may be confined by the first parallel-trench 41A. The second side surface S2 may be confined by the second parallel-trench 41B. The third side surface S3 may be confined by the first intersect-trench 49A. The fourth side surface S4 may be confined by the second intersect-trench 49B. The second side surface S2 may be parallel to the first side surface S1, and the fourth side surface S4 may be parallel to the third side surface S3. The first side surface S1 may be longer than the third side surface S3. For example, the horizontal length of the first side surface S1 may be greater than that of the third side surface S3 by two times or more. A first end 45E1 of the active region 45 may be defined at an area at which the second side surface S2 meets the third side surface S3, and a second end 45E2 of the active region 45 may be defined at an area at which the first side surface S1 meets the fourth side surface S4. The second end 45E2 may be interpreted as being in a point-symmetric relation to the first end 45E1.

The second parallel-trench 41B and the first intersect-trench 49A may form a second acute angle θ2. For example, the second acute angle θ2 may be about 28°. As shown in FIG. 15H, the second acute angle θ2 may be interpreted as a crossing angle between the second side surface S2 and the third side surface S3.

Figure 15I:
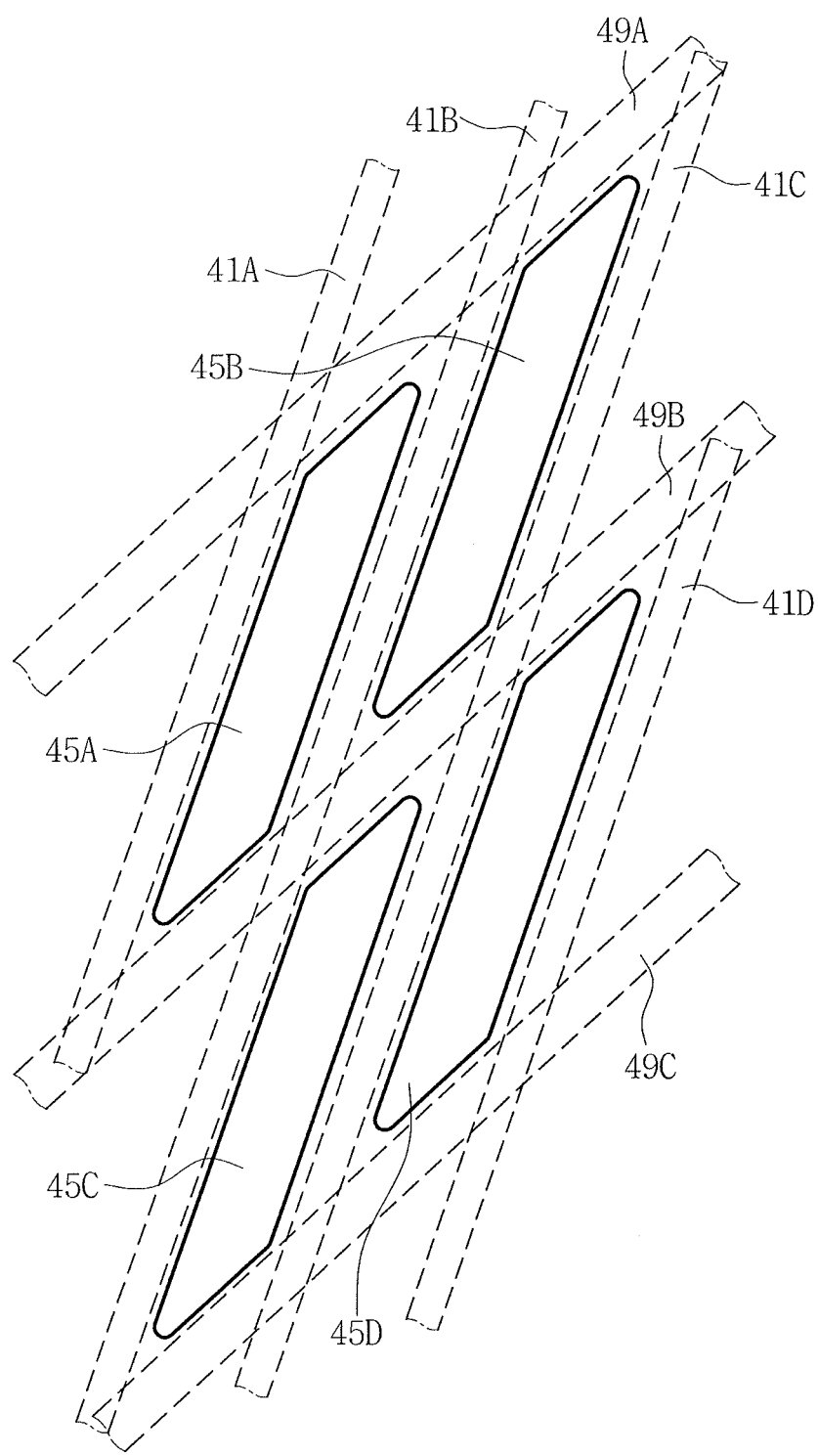

Referring to FIG. 15I, a first parallel-trench 41A, a second parallel-trench 41B parallel to the first parallel-trench 41A, a third parallel-trench 41C parallel to the second parallel-trench 41B, and a fourth parallel-trench 41D parallel to the third parallel-trench 41C may be provided. A first intersect-trench 49A, a second intersect-trench 49B parallel to the first intersect-trench 49A, and a third intersect-trench 49C parallel to the second intersect-trench 49B may be provided. A first active region 45A may be confined by the first parallel-trench 41A, the second parallel-trench 41B, the first intersect-trench 49A, and the second intersect-trench 49B. A second active region 45B may be confined by the second parallel-trench 41B, the third parallel-trench 41C, the first intersect-trench 49A, and the second intersect-trench 49B. A third active region 45C may be confined by the second parallel-trench 41B, the third parallel-trench 41C, the second intersect-trench 49B, and the third intersect-trench 49C. A fourth active region 45D may be confined by the third parallel-trench 41C, the fourth parallel-trench 41D, the second intersect-trench 49B, and the third intersect-trench 49C.

Figure 15J:
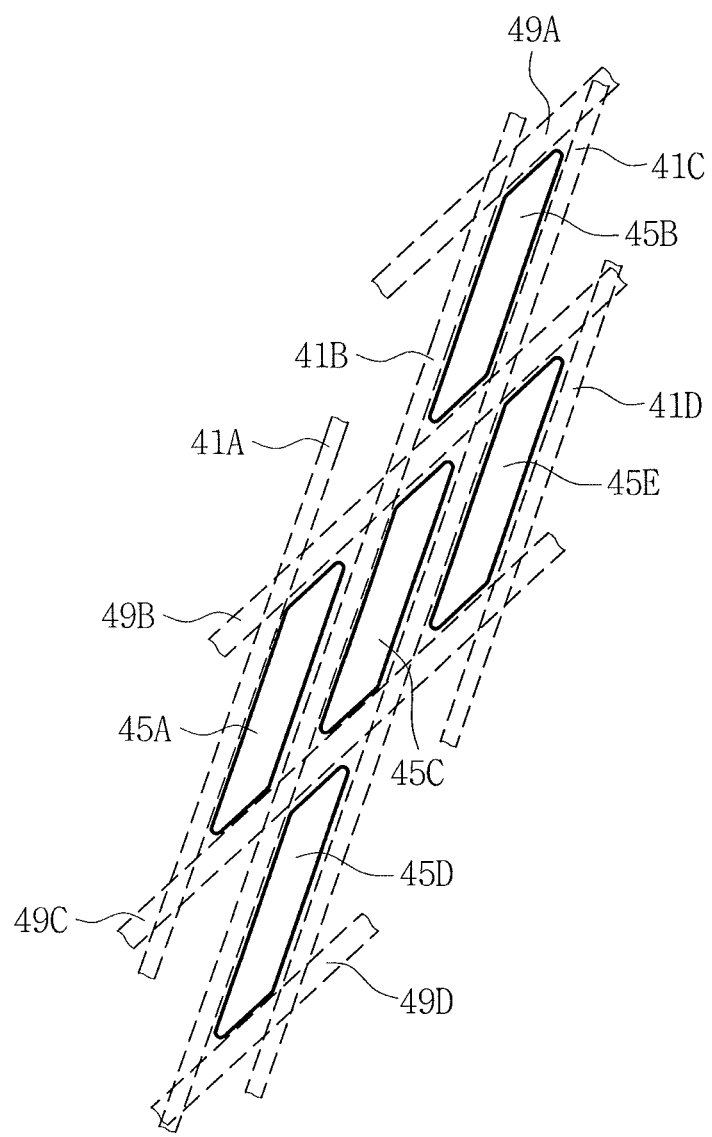

Referring to FIG. 15J, a first parallel-trench 41A, a second parallel-trench 41B parallel to the first parallel-trench 41A, a third parallel-trench 41C parallel to the second parallel-trench 41B, and a fourth parallel-trench 41D parallel to the third parallel-trench 41C may be provided. A first intersect-trench 49A, a second intersect-trench 49B parallel to the first intersect-trench 49A, a third intersect-trench 49C parallel to the second intersect-trench 49B, and a fourth intersect-trench 49D parallel to the third intersect-trench 49C may be provided.

The first active region 45A may be confined by the first parallel-trench 41A, the second parallel-trench 41B, the second intersect-trench 49B, and the third intersect-trench 49C. The second active region 45B may be confined by the second parallel-trench 41B, the third parallel-trench 41C, the first intersect-trench 49A, and the second intersect-trench 49B. The third active region 45C may be confined by the second parallel-trench 41B, the third parallel-trench 41C, the second intersect-trench 49B, and the third intersect-trench 49C. The fourth active region 45D may be confined by the second parallel-trench 41B, the third parallel-trench 41C, the third intersect-trench 49C, and the fourth intersect-trench 49D. A fifth active region 45E may be confined by the third parallel-trench 41C, the fourth parallel-trench 41D, the second intersect-trench 49B, and the third intersect-trench 49C.

Figure 15K:
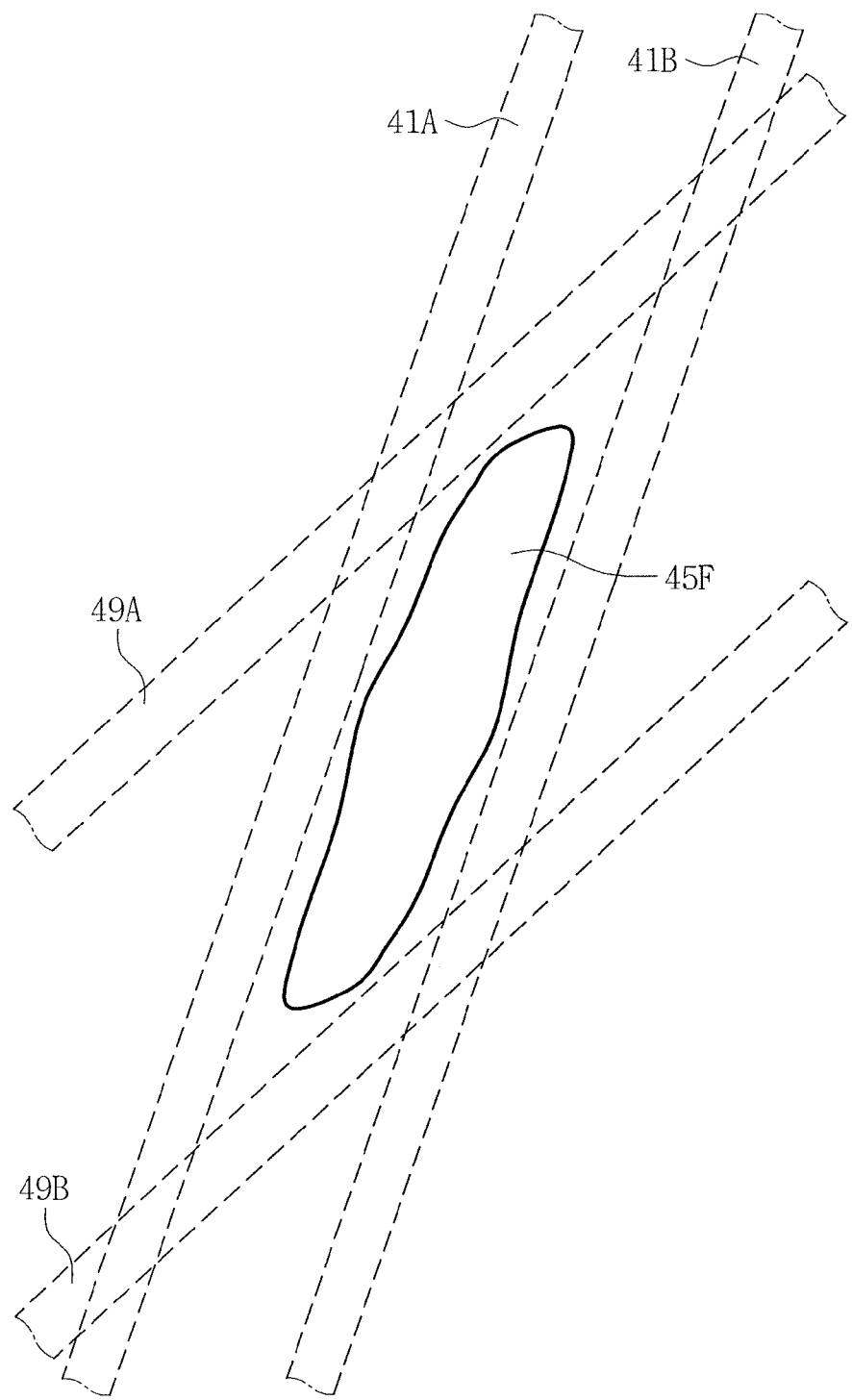

Referring to FIG. 15K, an active region 45F may be confined by the first parallel-trench 41A, the second parallel-trench 41B, the first intersect-trench 49A, and the second intersect-trench 49B. Side surfaces of the active region 45F may be an amoeba, e.g., may have a curvy and/or wavy shape due to process deviation.

Figure 16A:
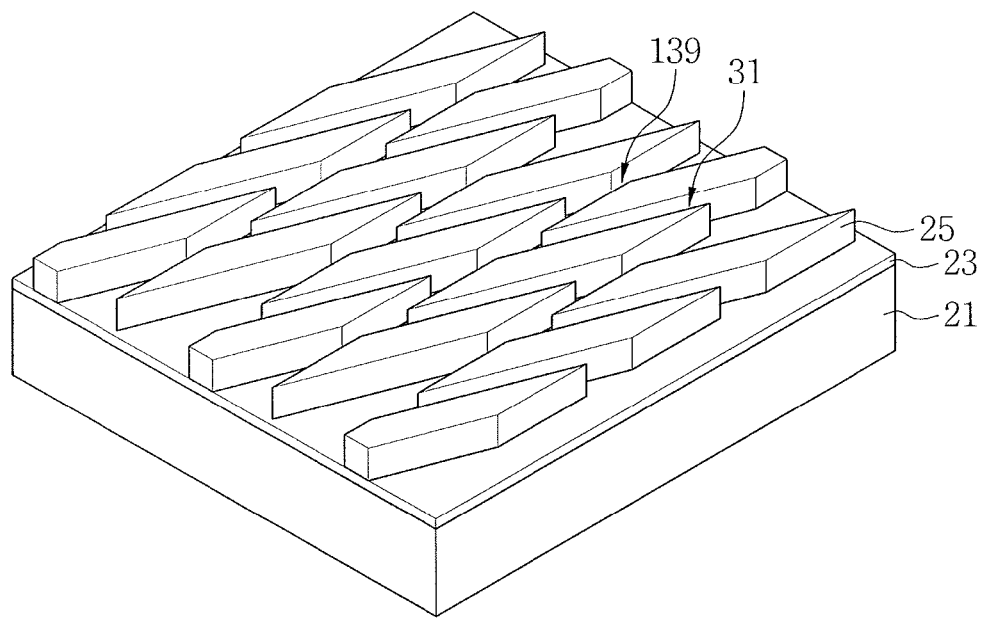
FIGS. 16A, 17, 18A, 18C, and 19A illustrate perspective views depicting stages in methods of forming a semiconductor device in accordance with exemplary embodiments.
Figure 16B:
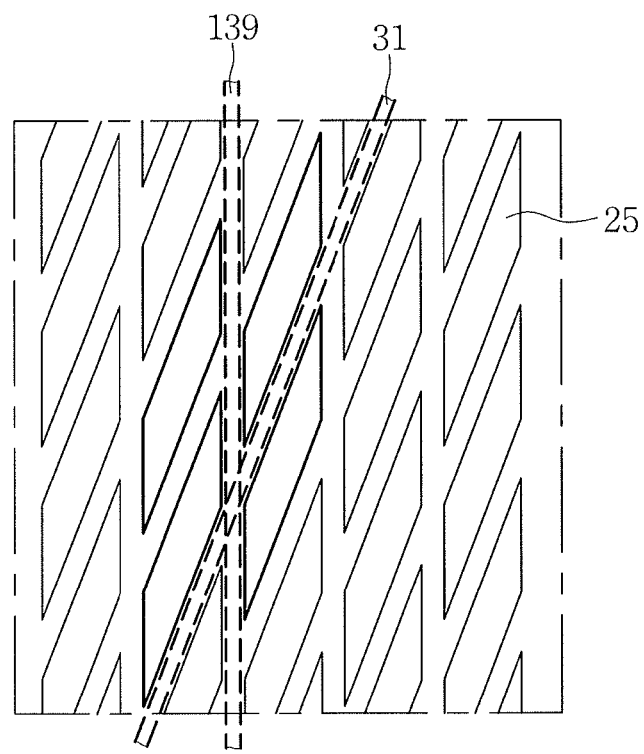
FIGS. 16B and 18B illustrate layout views depicting stages in methods of forming a semiconductor device in accordance with exemplary embodiments.
Figure 17:
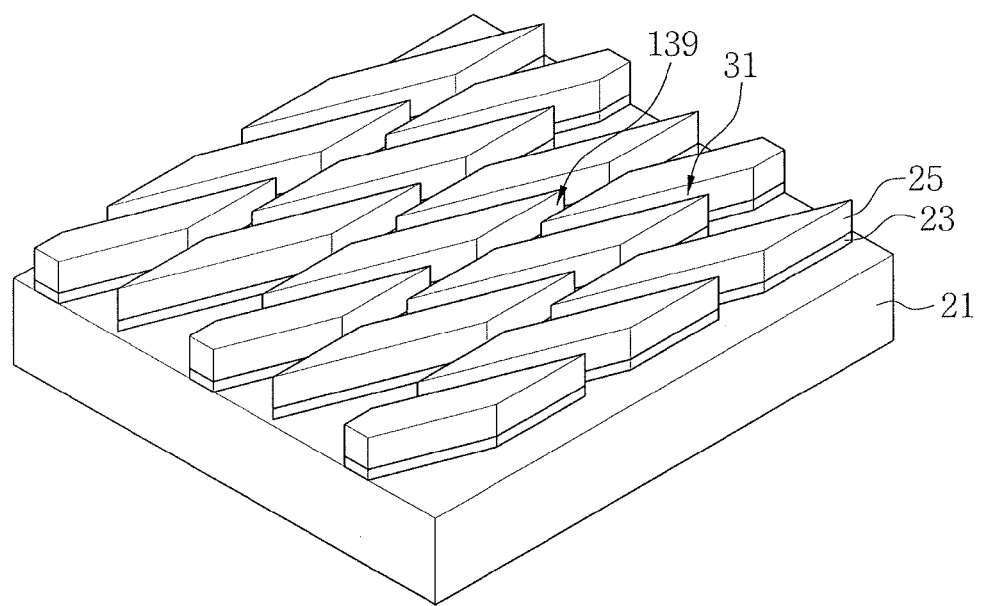
Figure 18A:
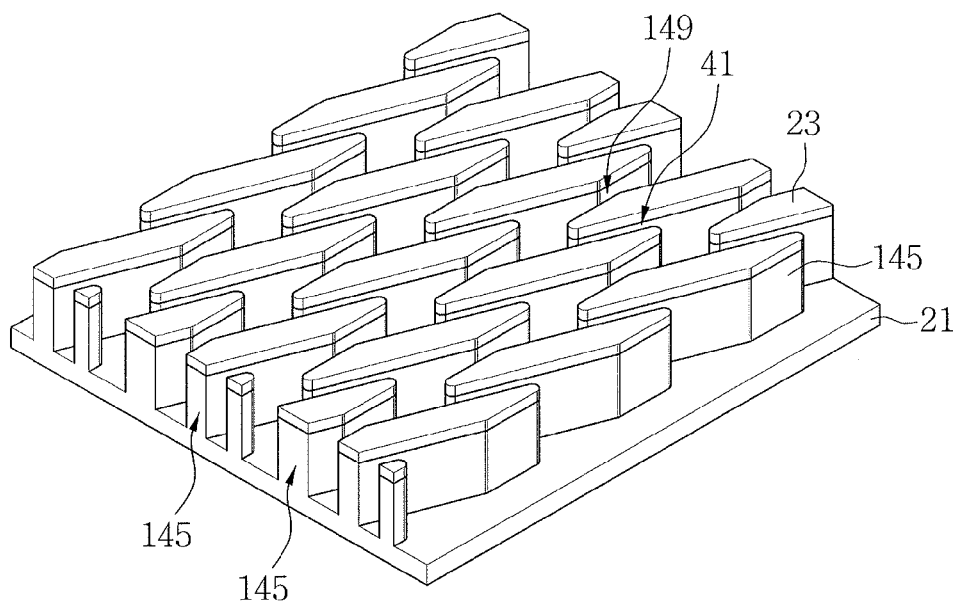
Figure 18B:
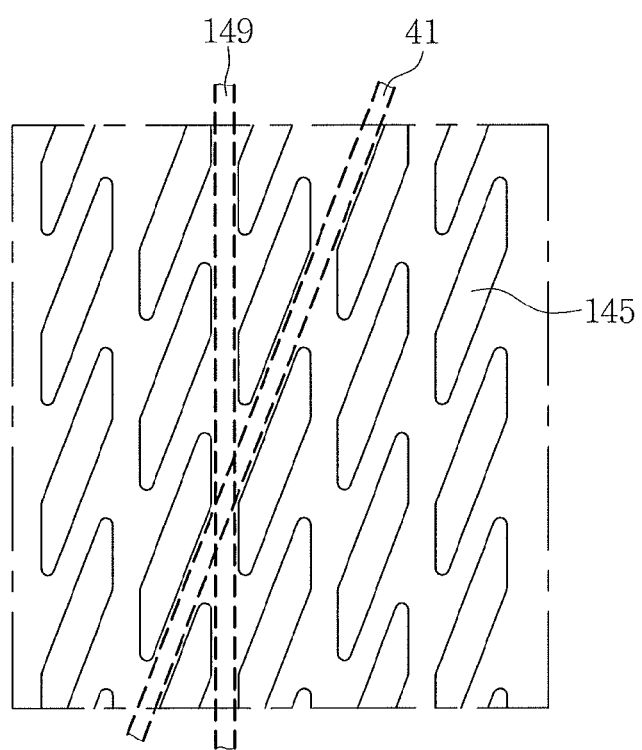

FIGS. 16A, 17, 18A, 18C, and 19A are perspective views for depicting stages in methods of forming a semiconductor device in accordance with embodiments, and FIGS. 16B and 18B are layout views. FIGS. 19B and 19C are enlarged views showing parts of FIG. 18B in detail.

Referring to FIGS. 16A and 16B, a first mask layer 23 and a second mask layer 25 may be formed on a semiconductor substrate 21. A plurality of preliminary parallel-trenches 31 to each other and a plurality of preliminary intersect-trenches 139 parallel to each other may be formed by patterning the second mask layer 25. The preliminary intersect-trenches 139 may cross the preliminary parallel-trenches 31.

Referring to FIG. 17, the first mask layer 23 may be exposed through, e.g., on bottoms of, the preliminary parallel-trenches 31 and preliminary intersect-trenches 139 may be removed using the second mask layer 25 as an etch mask. An anisotropic etching process may be applied to the removal of the first mask layer 23. The semiconductor substrate 21 may be exposed on the bottoms of the preliminary parallel-trenches 31 and the preliminary intersect-trenches 139. The first mask layer 23 may be retained between the second mask layer 25 and the semiconductor substrate 21.

Referring to FIGS. 18A and 18B, parallel-trenches 41 and intersect-trenches 149 may be formed by etching the semiconductor substrate 21 using the second mask layer 25 and the first mask layer 23 as an etch mask. A plurality of active regions 145 may be defined by the parallel-trenches 41 and the intersect-trenches 149.

An anisotropic etching process may be applied to the formation of the parallel-trenches 41 and the intersect-trenches 149. The second mask layer 25 may also be etched while the parallel-trenches 41 and the intersect-trenches 149 are formed. The parallel-trenches 41 and the intersect-trenches 149 may be aligned on the bottoms of the preliminary parallel-trenches 31 and the preliminary intersect-trenches 139, respectively. Each of the active regions 145 may have a horizontal length longer than a horizontal width.

Referring again to FIG. 6, a plurality of word lines 67 crossing the active regions 145 may be formed. A plurality of bit lines 75 crossing over the active regions 145 and the word lines 67 may be formed. A plurality of data storage elements 85 may be formed on the semiconductor substrate 21. The intersect-trenches 149 may be parallel to the bit lines 75.

Figure 18C:
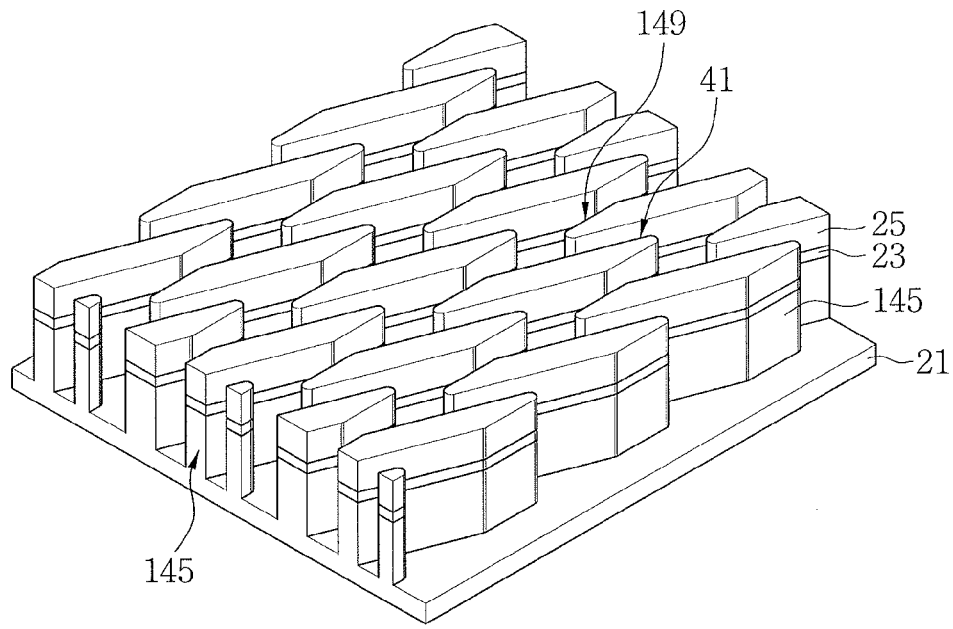

Referring to FIG. 18C, in another embodiment, the second mask layer 25 may be retained on the first mask layer 23. Each of the parallel-trenches 41 and the intersect-trenches 149 may be aligned on the bottoms of the preliminary parallel-trenches 31 and the preliminary intersect-trenches 139.

Figure 19A:
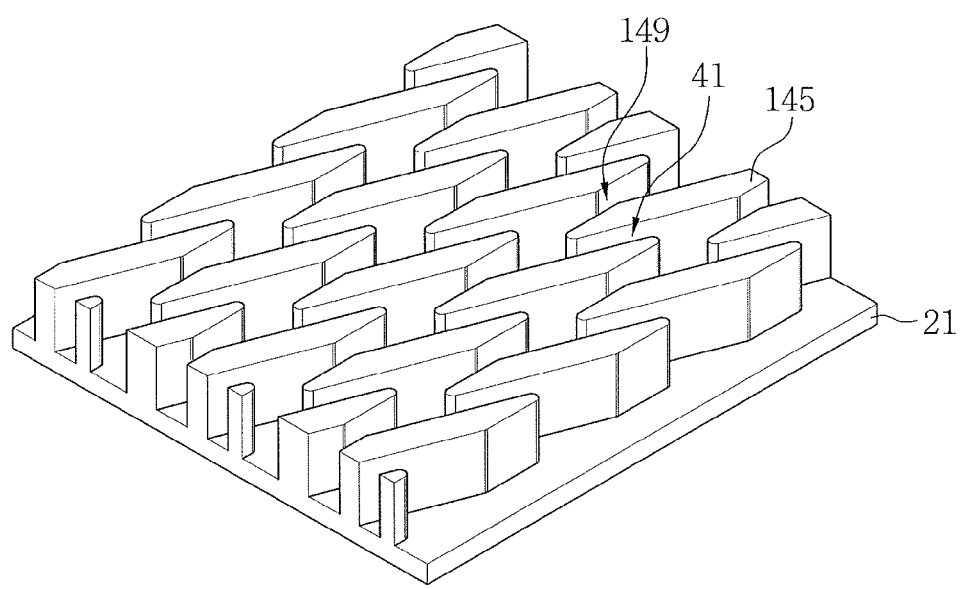
Figure 19B:
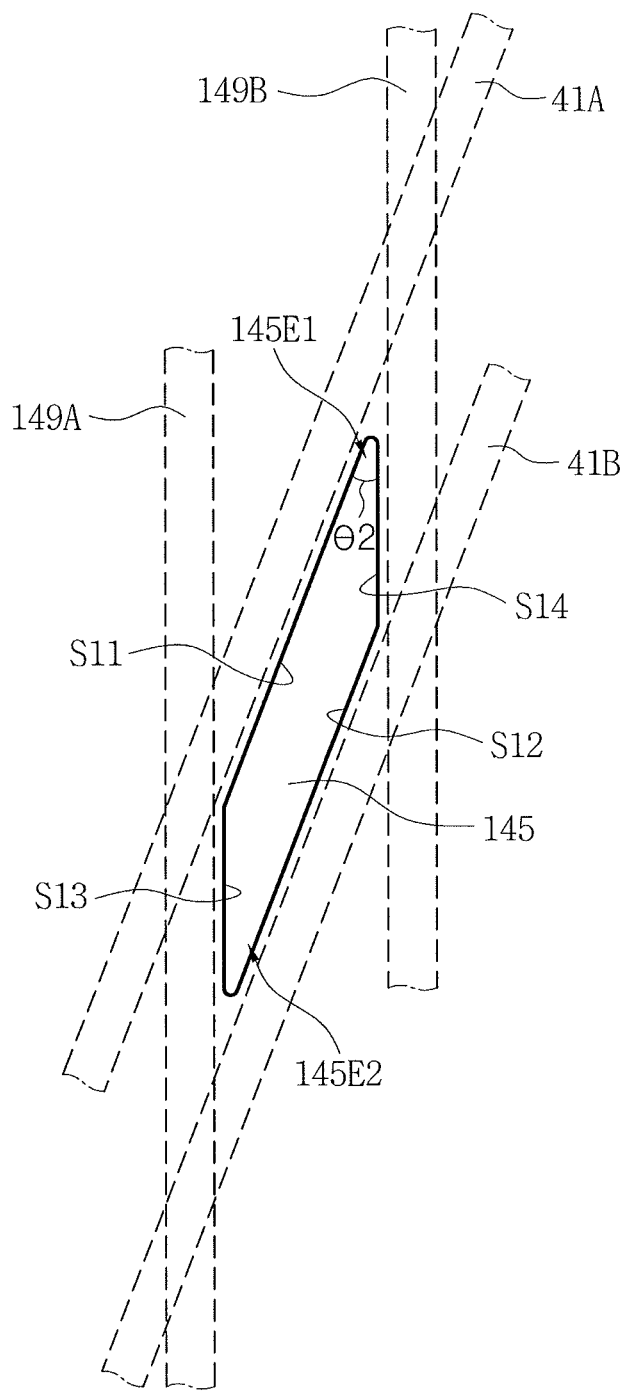
FIGS. 19B and 19C illustrate enlarged views showing parts of FIG. 18B in detail.
Figure 19C:
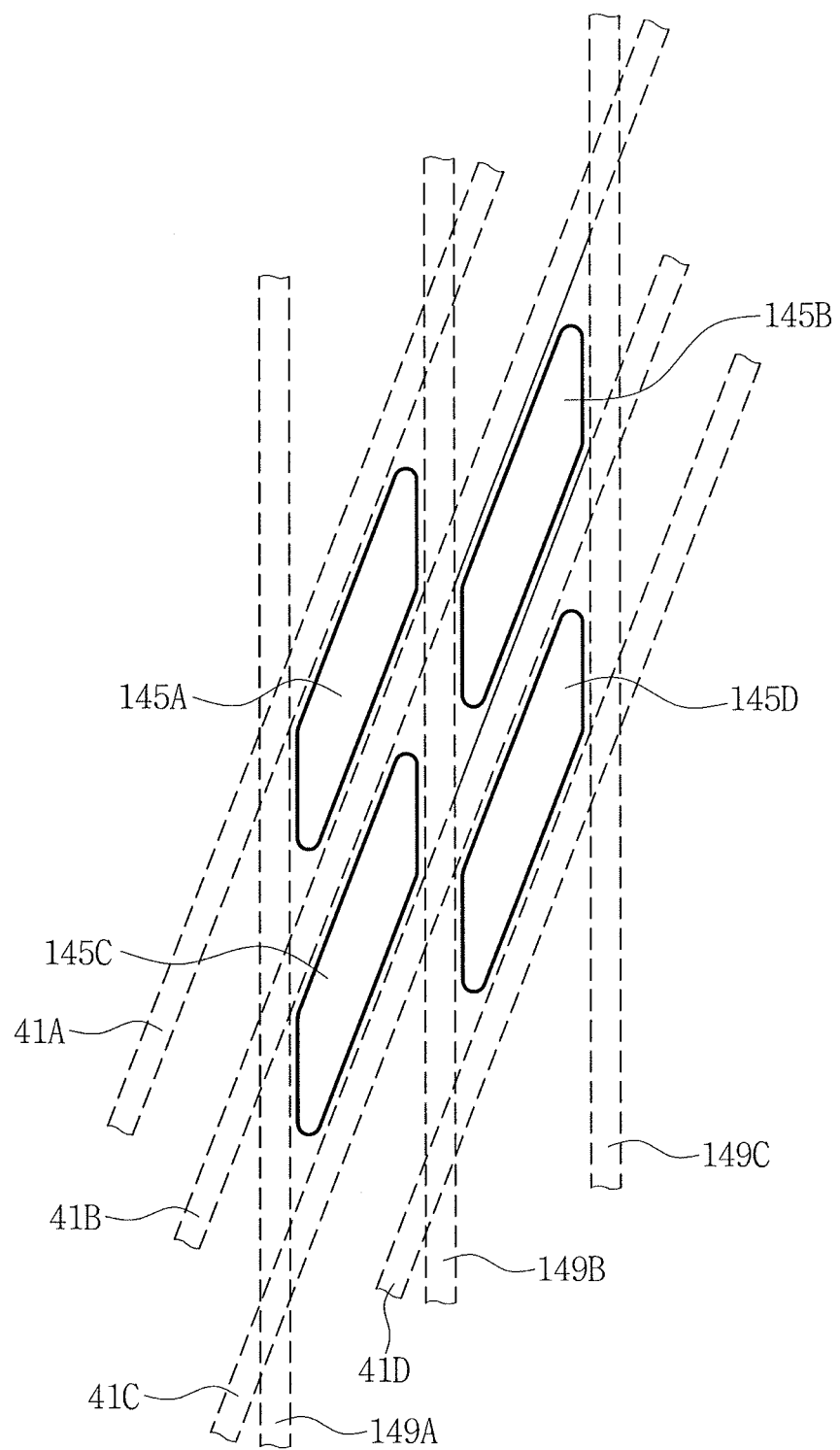

Referring to FIG. 19A, in another embodiment, the active regions 145 may be exposed by removing the second mask layer 25 and the first mask layer 23. The active regions 145 may be confined by the parallel-trenches 41 and the intersect-trenches 149.

Referring to FIG. 19B, a first parallel-trench 41A and a second parallel-trench 41B parallel to the first parallel-trench 41A may be provided. A first intersect-trench 149A and a second intersect-trench 149B parallel to the first intersect-trench 149A may be provided. The active region 145 may be confined by the first parallel-trench 41A, the second parallel-trench 41B, the first intersect-trench 149A, and the second intersect-trench 149B.

The active region 145 may include first to fourth side surfaces S11, S12, S13, and S14. The first side surface S11 may be confined by the first parallel-trench 41A. The second side surface S12 may be confined by the second parallel-trench 41B. The third side surface S13 may be confined by the first intersect-trench 149A. The fourth side surface S14 may be confined by the second intersect-trench 149B. The second side surface S12 may be parallel to the first side surface S11, and the fourth side surface S14 may be parallel to the third side surface S13. The first side surface S11 may be longer than the third side surface S13. A first end 145E1 of the active region 145 may be defined at an area at which the first side surface S11 meets the fourth side surface S14, and a second end 145E2 of the active region 145 may be defined at an area at which the second side surface S12 meets the third side surface S13. The second end 145E2 may be interpreted as being in a point-symmetric relation to the first end 145E1.

The first parallel-trench 41A and the second intersect-trench 149B may form a second acute angle θ2. For example, the second acute angle θ2 may be about 21°. As shown in FIG. 19B, the second acute angle θ2 may be interpreted as a crossing angle between the first side surface S11 and the fourth side surface S14.

Referring to FIG. 19C, a first parallel-trench 41A, a second parallel-trench 41B parallel to the first parallel-trench 41A, a third parallel-trench 41C parallel to the second parallel-trench 41B, and a fourth parallel-trench 41D parallel to the third parallel-trench 41C may be provided. A first intersect-trench 149A, a second intersect-trench 149B parallel to the first intersect-trench 149A, and a third intersect-trench 149C parallel to the second intersect-trench 149B may be provided. A first active region 145A may be confined by the first parallel-trench 41A, the second parallel-trench 41B, the first intersect-trench 149A, and the second intersect-trench 149B. A second active region 145B may be confined by the second parallel-trench 41B, the third parallel-trench 41C, the second intersect-trench 149B, and the third intersect-trench 149C. A third active region 145C may be confined by the second parallel-trench 41B, the third parallel-trench 41C, the first intersect-trench 149A, and the second intersect-trench 149B. A fourth active region 145D may be confined by the third parallel-trench 41C, the fourth parallel-trench 41D, the second intersect-trench 149B, and the third intersect-trench 149C.

Figure 20:
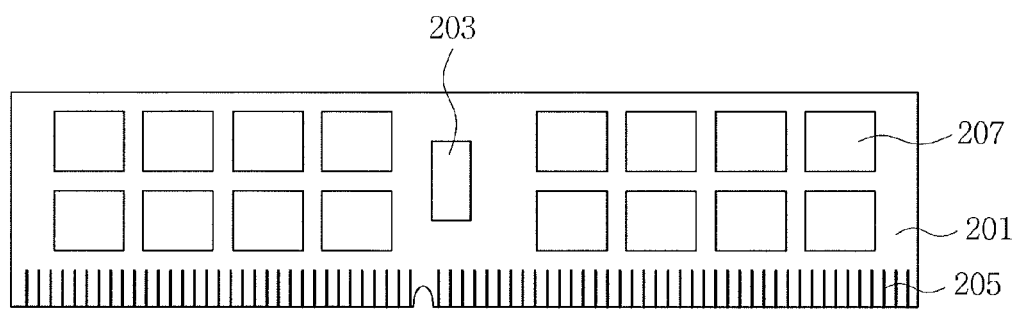
FIG. 20 illustrates a layout view of a semiconductor module in accordance with exemplary embodiments.

FIG. 20 is a layout view for describing a semiconductor module in accordance with embodiments.

Referring to FIG. 20, the semiconductor module in accordance with embodiments may include a module substrate 201, two or more semiconductor packages 207, and a control chip package 203. Input/output terminals 205 may be formed on the module substrate 201. At least one of the semiconductor packages 207 and control chip package 203 may have a similar configuration to the embodiments described with reference to FIGS. 1 to 19C. For example, the active regions (reference number 45 in FIG. 1) and the bit lines (reference number 75 in FIG. 1) may be formed in the semiconductor packages 207 and/or the control chip package 203, and electrically connected to the input/output terminals 205. For example, due to the configuration of the active regions (reference number 45 in FIG. 1) and the bit lines (reference number 75 in FIG. 1), the semiconductor module may have superior electrical characteristics.

The semiconductor packages 207 and the control chip package 203 may be installed in the module substrate 201. The semiconductor packages 207 and the control chip package 203 may be electrically connected in series/parallel to the input/output terminals 205.

The control chip package 203 may be omitted. The semiconductor packages 207 may include a volatile memory chip such as a dynamic random access memory (DRAM) or a static random access memory (SRAM), a non-volatile memory chip such as a flash memory, a phase change memory, a magnetic random access memory (MRAM), and a resistive random access memory (RRAM), or a combination thereof. The semiconductor module in accordance with embodiments may be a memory module.

Figure 21:
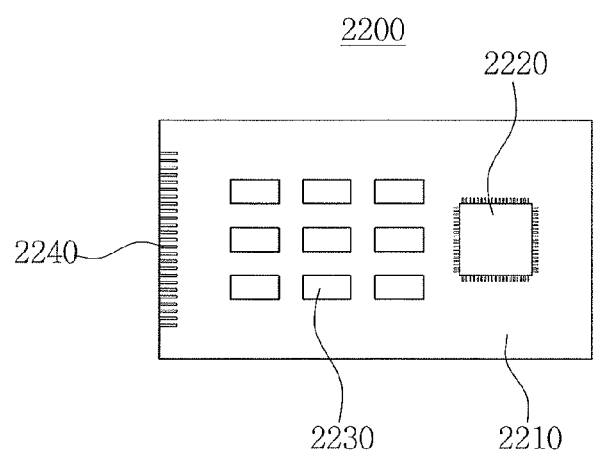
FIG. 21 illustrates a schematic view showing a memory card including at least one of the semiconductor devices in accordance with various exemplary embodiments.

FIG. 21 is a schematic view showing a memory card 2200 including at least one of the semiconductor devices in accordance with various embodiments.

Referring to FIG. 21, the memory card 2200 in accordance with an embodiment may include a microprocessor 2220 and two or more semiconductor packages 2230 mounted on a memory card board 2210. At least one of the microprocessor 2220 and the semiconductor packages 2230 may include a configuration described with reference to FIGS. 1 to 19C. For example, the active regions (reference number 45 in FIG. 1) and the bit lines (reference number 75 in FIG. 1) may be formed in the semiconductor packages 2230 and/or the microprocessor 2220. Input/out terminals 2240 may be arranged on at least one side of the memory card board 2210.

Figure 22:
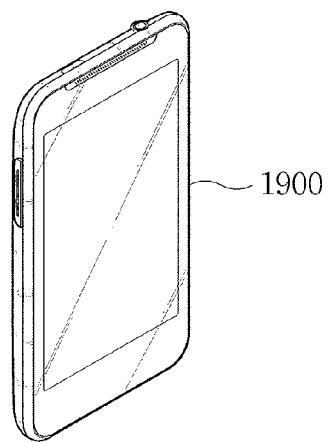
FIG. 22 illustrates a perspective view showing an electrical apparatus in accordance with exemplary embodiments.

FIG. 22 is a perspective view showing an electrical apparatus in accordance with embodiments.

Referring to FIG. 22, the semiconductor device described with reference to FIGS. 1 to 19C may be usefully applied to electronic systems such as a mobile phone 1900, a netbook, a notebook, or a tablet PC. For example, the semiconductor device described with reference to FIGS. 1 to 19C may be mounted on a mainboard in the mobile phone 1900. Further, the semiconductor package described with reference to FIGS. 1 to 19C may be provided in an expansion apparatus such as an external memory card to be combined with the mobile phone 1900.

The mobile phone 1900 may be understood as a tablet PC. In addition, at least one of the semiconductor devices in accordance with embodiments may be used in a portable computer such as a notebook, a Moving Picture Experts Group (MPEG)-1 audio layer 3 (MP3) player, an MP4 player, a navigation apparatus, a solid state disk (SSD), a table computer, an automobile, or a home appliance, as well as the tablet PC.

Figure 23:
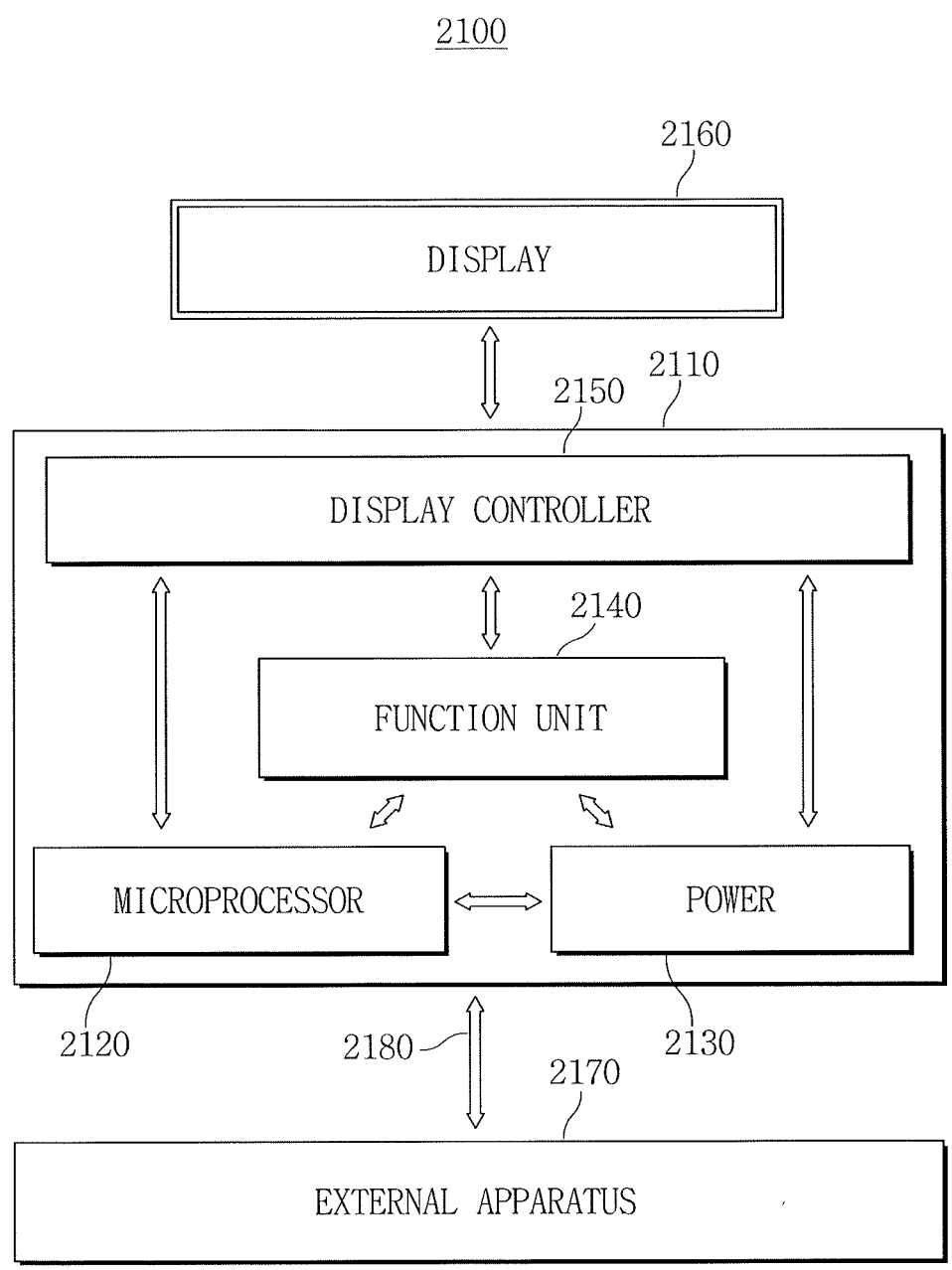
FIG. 23 illustrates a system block diagram showing an electronic apparatus in accordance with exemplary embodiments.

FIG. 23 is a system block diagram showing an electronic apparatus in accordance with embodiments.

Referring to FIG. 23, the semiconductor device described with reference to FIGS. 1 to 19C may be applied to an electronic system 2100. The electronic system 2100 may include a body 2110, a microprocessor 2120, a power 2130, a function unit 2140, and a display controller 2150. The body 2110 may be a motherboard having a printed circuit board (PCB). The microprocessor 2120, the power 2130, the function unit 2140, and the display controller 2150 may be installed on the body 2110. A display 2160 may be installed inside or outside of the body 2110. For example, the display 2160 may be disposed on a surface of the body 2110 to display an image processed by the display controller 2150.

The power 2130 may function to receive a constant voltage from an external battery, etc., divide the voltage into required levels, and supply those voltages to the microprocessor 2120, the function unit 2140, and the display controller 2150. The microprocessor 2120 may receive the voltage from the power 2130 to control the function unit 2140 and the display 2160. The function unit 2140 may perform functions of various electronic systems 2100. For example, if the electronic system 2100 is a cellular phone, the function unit 2140 may have several components which can perform functions of a cellular phone such as dialing, video output to the display 2160 through communication with an external apparatus 2170, and sound output to a speaker, and if a camera is installed, the function unit 2140 may function as a camera image processor.

When the electronic system 2100 is connected to a memory card, etc. to expand capacity, the function unit 2140 may be a memory card controller. The function unit 2140 may exchange signals with the external apparatus 2170 through a wired or wireless communication unit 2180. Further, when the electronic system 2100 needs a universal serial bus (USB), etc. in order to expand functionality, the function unit 2140 may function as an interface controller. The function unit 2140 may include a mass storage device.

The semiconductor device described with reference to FIGS. 1 to 19C may be applied to the microprocessor 2120 or the function unit 2140. For example, the function unit 2140 may include the active regions (reference number 45 in FIG. 1) and the bit lines (reference number 75 in FIG. 1). The function unit 2140 may have superior electrical characteristics, e.g., due to the configuration of the active regions and the bit lines.

Figure 24:
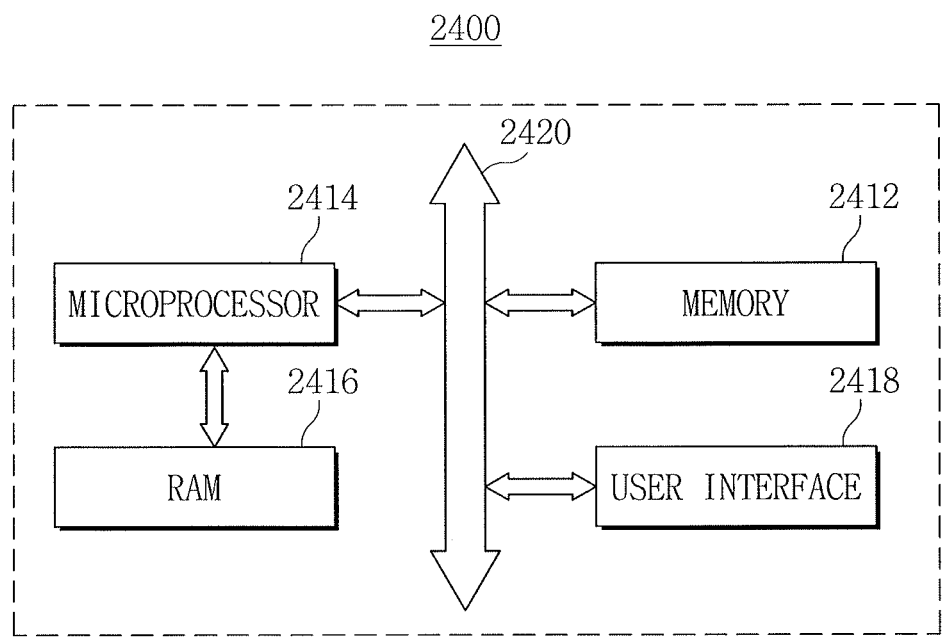
FIG. 24 illustrates a system block diagram schematically showing another electronic system including at least one of the semiconductor devices in accordance with exemplary embodiments.

FIG. 24 is a system block diagram schematically showing another electronic system 2400 including at least one of the semiconductor devices in accordance with embodiments.

Referring to FIG. 24, the electronic system 2400 may include at least one of the semiconductor devices in accordance with the various embodiments. The electronic system 2400 may be used to fabricate a mobile apparatus or a computer. For example, the electronic system 2400 may include a memory system 2412, a microprocessor 2414, a random access memory (RAM) 2416, and a user interface 2418 performing data communication using a bus 2420. The microprocessor 2414 may program and control the electronic system 2400. The RAM 2416 may be used as an operation memory of the microprocessor 2414. For example, the microprocessor 2414 or the RAM may include at least one of the semiconductor devices in accordance with the embodiments. The microprocessor 2414, the RAM 2416, and/or other components can be assembled in a single package. The user interface 2418 may be used to input data to or output data from the electronic system 2400. The memory system 2412 may store codes for operating the microprocessor 2414, data processed by the microprocessor 2414, or external input data. The memory system 2412 may include a controller and a memory.

By way of summation and review, a plurality of active regions may be arranged in a memory cell, e.g., in a DRAM cell array region. Sizes and shapes of the active regions may directly affect high integration of a resultant semiconductor device.

A method of forming a line-type preliminary mask pattern on a semiconductor substrate, forming a plurality of mask patterns by trimming the line-type preliminary mask pattern to hole shapes, and forming active regions by etching the semiconductor substrate using the mask patterns as an etching mask, has been attempted. A bit line crossing over the active regions may be formed. A buried contact plug connected to one of the active regions without contacting the bit line may be arranged. In this case, a contact area between the buried contact plug and the active region may be very small. Accordingly, it is difficult to reduce contact resistance between the buried contact plug and the active region.

Further, the technology of trimming the line-type preliminary mask pattern to the hole shapes is relatively difficult and the deviations in sizes between the active regions may be relatively large. Also, two or more photolithography processes are required in the technology of trimming the line-type preliminary mask pattern to the hole shapes, in accordance with high integration of pattern density. Therefore, the technology of trimming the line-type preliminary mask pattern to the hole shapes may be relatively difficult.

In contrast, embodiments relate to a semiconductor device having an active region and an improved method of forming the same. For example, embodiments relate to a semiconductor device having high integration and having an active region that obtains a sufficient contact area with a contact plug, and a method of forming the same. Further, in accordance with the embodiments, a plurality of active regions confined by parallel-trenches and intersect-trenches may be provided. Each of the parallel-trenches and the intersect-trenches may be a straight line.

The technology of forming the intersect-trenches may be effective to simplify the processes and reduce the process deviation compared to a method that includes forming the hole-type trenches. The embodiments may implement a semiconductor device which achieves high integration and obtains a sufficient contact area between a contact plug and an active region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a plurality of parallel-trenches parallel to each other on a semiconductor substrate;
a plurality of intersect-trenches parallel to each other on the semiconductor substrate;
a plurality of active regions confined by the parallel-trenches and the intersect-trenches on the semiconductor substrate;
a plurality of lower conductive lines crossing the active regions;
a plurality of upper conductive lines that are parallel to each other, that cross the lower conductive lines, and that cross over the active regions; and
data storage elements connected to the active regions, wherein:
each of the parallel-trenches and the intersect-trenches is a straight line,
the parallel-trenches cross the upper conductive lines and form a first acute angle with the upper conductive lines, and
the intersect-trenches cross the parallel-trenches and form a second acute angle with the parallel-trenches.

2. The semiconductor device as claimed in claim 1, wherein the intersect-trenches cross the upper conductive lines, and the second acute angle is greater than the first acute angle.

3. The semiconductor device as claimed in claim 2, wherein the intersect-trenches form a third acute angle greater than the second acute angle with the upper conductive lines.

4. The semiconductor device as claimed in claim 1, wherein the intersect-trenches are parallel to the upper conductive lines, and the second acute angle is substantially the same as the first acute angle.

5. The semiconductor device as claimed in claim 1, wherein each of the lower and upper conductive lines is a straight line, and the upper conductive lines form substantially right angles with the lower conductive lines.

6. The semiconductor device as claimed in claim 1, wherein spaces between the intersect-trenches are greater than other spaces between the parallel-trenches.

7. A semiconductor device, comprising:
first and second parallel-trenches parallel to each other on a semiconductor substrate;
first and second intersect-trenches parallel to each other on the semiconductor substrate;
an active region confined by the first and second parallel-trenches and the first and second intersect-trenches on the semiconductor substrate;
a pair of word lines crossing the active region and parallel to each other;
a bit line crossing over the active region and forming substantially right angles with the pair of word lines;
a buried contact plug spaced apart from the bit line and connected to the active region; and
a storage node on the buried contact plug, wherein:
each of the first and second parallel-trenches and the first and second intersect-trenches is a straight line,
the first and second parallel-trenches cross the bit line and form a first acute angle with the bit line, and
the first and second intersect-trenches cross the first and second parallel trenches, and form a second acute angle with the first and second parallel-trenches.

8. The semiconductor device as claimed in claim 7, wherein:
the active region includes a first side surface, a second side surface, a third side surface, and a fourth side surface,
the first side surface is confined by the first parallel-trench, the second side surface is confined by the second parallel-trench, the third side surface is confined by the first intersect-trench, and the fourth side surface is confined by the second intersect-trench, and the second side surface is parallel to the first side surface, and the fourth side surface is parallel to the third side surface.

9. The semiconductor device as claimed in claim 8, wherein the first side surface is longer than the third side surface.

10. The semiconductor device as claimed in claim 8, wherein the first side surface is at least two times longer than the third side surface.

11. The semiconductor device as claimed in claim 8, wherein:
the active region includes a first end and a second end protruding away from the bit line, and
the second side surface and the third side surface meet at the first end, and the first side surface and the fourth side surface meet at the second end.

12. The semiconductor device as claimed in claim 11, wherein the second end is in a point-symmetric relation to the first end.

13. The semiconductor device as claimed in claim 11, wherein the buried contact plug is connected to the first end.

14. The semiconductor device as claimed in claim 11, wherein the first and second intersect-trenches cross the bit line, and the second acute angle is greater than the first acute angle.

15. The semiconductor device as claimed in claim 14, wherein the second acute angle is about 28 degrees.

16. The semiconductor device as claimed in claim 14, wherein the first and second intersect-trenches form a third acute angle greater than the second acute angle with the bit line.

17. The semiconductor device as claimed in claim 8, wherein:
the active region includes a first end and a second end protruding away from the bit line, and
the first side surface and the fourth side surface meet at the first end, and the second side surface and the third side surface meet at the second end.

18. The semiconductor device as claimed in claim 17, wherein the first and second intersect-trenches are parallel to the bit line, and the second acute angle is substantially the same as the first acute angle.

19. The semiconductor device as claimed in claim 17, wherein the second acute angle is about 21 degrees.

20. A semiconductor device, comprising:
parallel-trenches that include first, second, third, and fourth parallel-trenches parallel to each other on a semiconductor substrate;
intersect trenches that include first, second, and third intersect-trenches parallel to each other on the semiconductor substrate;
active regions that include first, second, third, and fourth active regions confined by the parallel-trenches and the intersect-trenches on the semiconductor substrate;
word lines that include first, second, third, fourth, and fifth word lines crossing the active regions and parallel to each other;
bit lines that include first and second bit lines crossing over the active regions and substantially forming right angles with the word lines;
buried contact plugs spaced apart from the bit lines and connected to the active regions; and
storage nodes on the buried contact plugs, wherein:
each of the parallel-trenches and the intersect-trenches is a straight line,
the parallel-trenches form a first acute angle with the bit lines,
the intersect-trenches cross the parallel-trenches and form a second acute angle with the parallel-trenches,
the first active region is confined by the first parallel-trench, the second parallel-trench, the first intersect-trench, and the second intersect-trench, the second active region is confined by the second parallel-trench, the third parallel-trench, the first intersect-trench, and the second intersect-trench, the third active region is confined by the second parallel-trench, the third parallel-trench, the second intersect-trench, and the third intersect-trench, and the fourth active region is confined by the third parallel-trench, the fourth parallel-trench, the second intersect-trench, and the third intersect-trench,
the first bit line crosses the first and third active regions, and the second bit line crosses the second and fourth active regions, and
the first word line crosses the second active region, the second word line crosses the first and second active regions, the third word line crosses the first and fourth active regions, the fourth word line crosses the third and fourth active regions, and the fifth word line crosses the third active region.

21. A semiconductor device, comprising:
a substrate;
parallel-trenches that are in a non-intersecting relationship with each other, each of the parallel-trenches being arranged at a slant with respect to a lateral side of the substrate and including an isolation layer therein;
intersect-trenches that are in a non-intersecting relationship with each other, the intersect-trenches having intersection regions with the parallel-trenches and including the isolation layer therein;
active regions, ends of the active regions being defined by the intersection regions; and
lower and upper conductive lines that extend across the active regions in first and second directions, respectively, the first direction being different from the second direction,
the parallel-trenches crossing the upper conductive lines at a first acute angle, the parallel trenches crossing the intersect-trenches at a second acute angle, and the intersection-trenches crossing the upper conductive lines at a third acute angle.

22. The semiconductor device as claimed in claim 21, wherein the third acute angle is greater than the first and second acute angles, and the second acute angle is greater than the first acute angle.

23. The semiconductor device as claimed in claim 21, wherein the parallel-trenches are spaced apart from each other at a first distance and the intersect-trenches are spaced apart from each other at a second distance, the second distance being greater than the first distance.

24. The semiconductor device as claimed in claim 21, wherein the parallel-trenches and the intersect-trenches are parallel to sides of the active regions without extending across the active regions so as to define isolation regions between the active regions.

25. The semiconductor device as claimed in claim 24, wherein each of the ends of the active regions is adjacent to one of the intersect-trenches such that ends of adjacent ones of the active regions are spaced apart from each other by the intersect-trenches.

* * * * *